(12) United States Patent
Hahn et al.

(10) Patent No.: US 8,987,107 B2
(45) Date of Patent: Mar. 24, 2015

(54) PRODUCTION OF HIGH-PERFORMANCE PASSIVE DEVICES USING EXISTING OPERATIONS OF A SEMICONDUCTOR PROCESS

(71) Applicant: Fairchild Semiconductor Corporation, San Jose, CA (US)

(72) Inventors: Daniel Hahn, Portland, ME (US); Steven Leibiger, Falmouth, ME (US); Sunglyong Kim, Falmouth, ME (US); Christopher Nassar, Portland, ME (US); James Hall, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/770,453

(22) Filed: Feb. 19, 2013

(65) Prior Publication Data

US 2014/0231952 A1  Aug. 21, 2014

(51) Int. Cl.

| | |
|---|---|
| H01L 21/20 | (2006.01) |
| H01L 49/02 | (2006.01) |
| H01L 29/66 | (2006.01) |
| H01L 27/06 | (2006.01) |
| H01L 29/94 | (2006.01) |
| H01L 29/732 | (2006.01) |

(52) U.S. Cl.
CPC .............. *H01L 28/75* (2013.01); *H01L 28/20* (2013.01); *H01L 29/66181* (2013.01); *H01L 27/0635* (2013.01); *H01L 29/94* (2013.01); *H01L 29/66272* (2013.01); *H01L 29/7322* (2013.01)
USPC ........................................................ 438/381

(58) Field of Classification Search
CPC ................................ H01L 28/40; H01L 28/20
USPC .......... 257/379, 516, 528, 532; 438/171, 190, 438/210, 238, 239, 329, 330, 250, 381, 382, 438/384, 393
See application file for complete search history.

(56) References Cited

U.S. PATENT DOCUMENTS

| | | | |
|---|---|---|---|
| 5,406,110 A | 4/1995 | Kwon et al. | |
| 6,204,105 B1 * | 3/2001 | Jung | 438/238 |
| 6,313,516 B1 * | 11/2001 | Tsui et al. | 257/538 |
| 6,700,474 B1 | 3/2004 | Leibiger | |
| 6,885,280 B2 | 4/2005 | Olson | |
| 7,691,717 B2 | 4/2010 | Chinthakindi et al. | |
| 8,581,316 B2 * | 11/2013 | Inoue et al. | 257/296 |
| 2004/0251517 A1 | 12/2004 | Nakashima | |
| 2008/0176370 A1 * | 7/2008 | Ko et al. | 438/253 |
| 2010/0102386 A1 | 4/2010 | You | |

(Continued)

*Primary Examiner* — Yu-Hsi D Sun
(74) *Attorney, Agent, or Firm* — Brake Hughes Bellermann LLP

(57) ABSTRACT

In one general aspect, a semiconductor processing method can include forming an N-type silicon region disposed within a P-type silicon substrate. The method can also include forming a field oxide (FOX) layer in the P-type silicon substrate where the FOX layer includes an opening exposing at least a portion of the N-type silicon region. The method can further include forming a reduced surface field (RESURF) oxide (ROX) layer having a first portion disposed on the exposed N-type silicon region and a second portion disposed on the FOX layer where the ROX layer includes a first dielectric layer in contact with the exposed N-type silicon region and a second dielectric layer disposed on the first dielectric layer. The method can further include forming a doped polysilicon layer having a first portion disposed on the first portion of the ROX layer and a second portion disposed on the second portion of the ROX layer.

19 Claims, 19 Drawing Sheets

(56) References Cited

U.S. PATENT DOCUMENTS

2011/0012170 A1  1/2011  Ohtsuka et al.
2011/0303977 A1  12/2011  Huang et al.
2012/0007103 A1  1/2012  Domeij

* cited by examiner

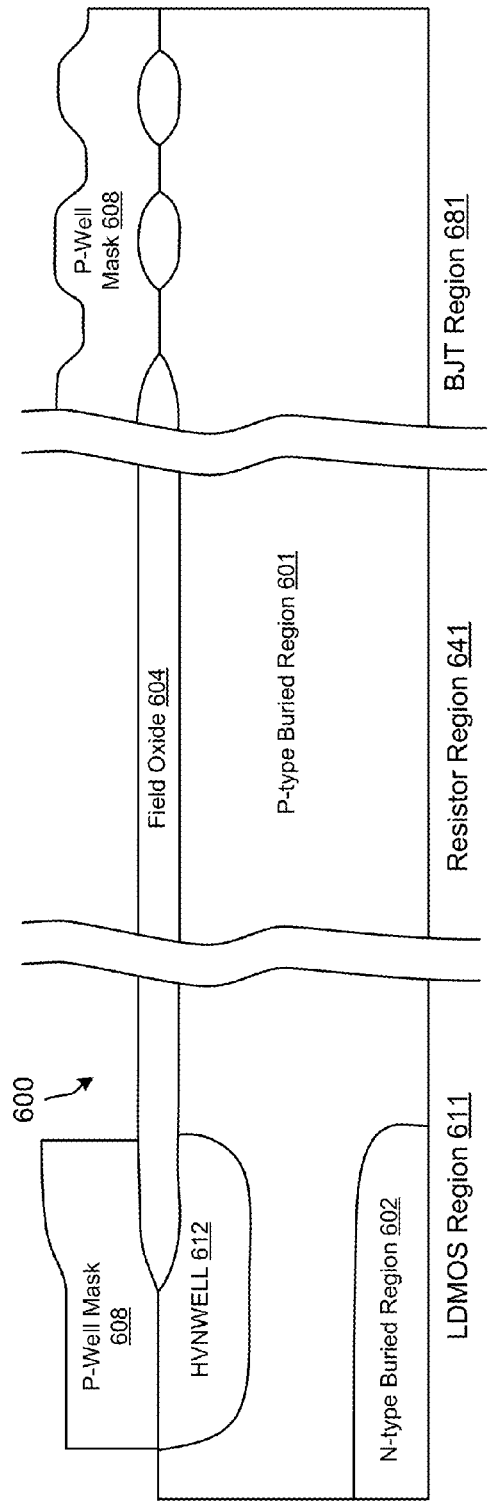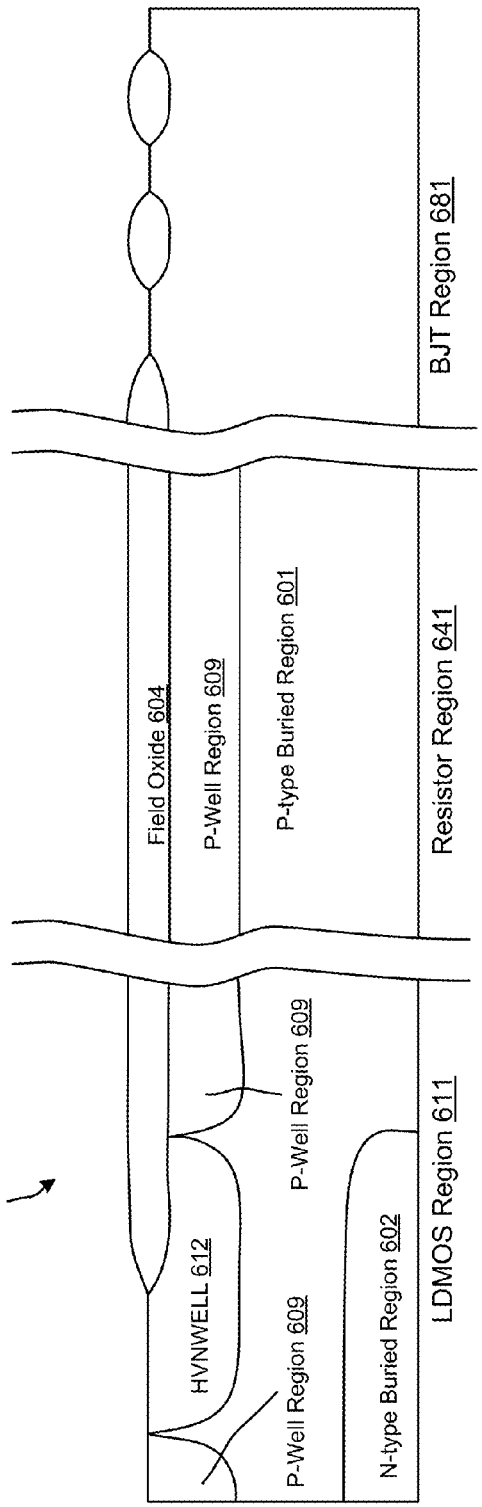

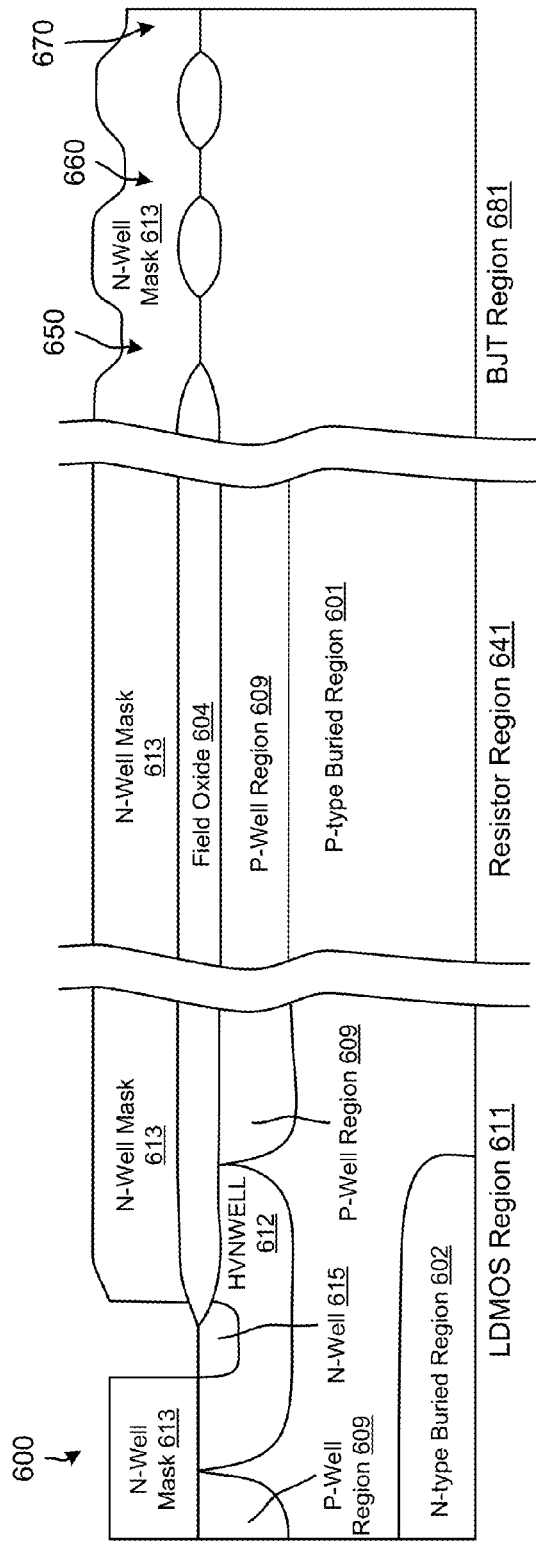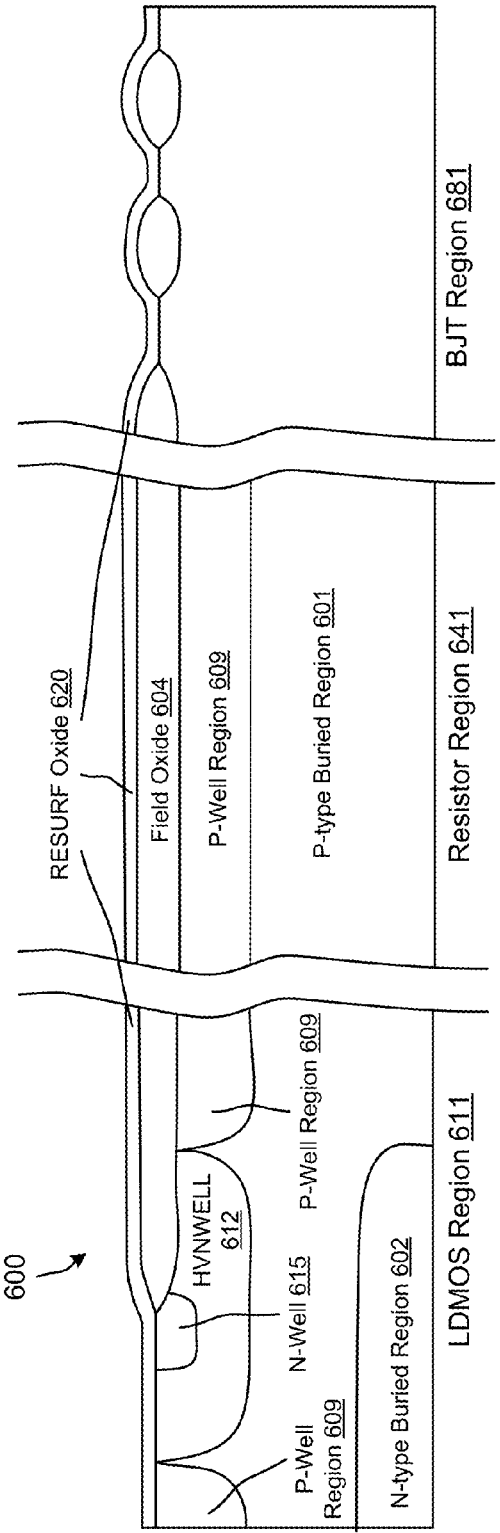

US 8,987,107 B2

PRODUCTION OF HIGH-PERFORMANCE PASSIVE DEVICES USING EXISTING OPERATIONS OF A SEMICONDUCTOR PROCESS

TECHNICAL FIELD

This description relates to producing passive electrical devices using a semiconductor process.

BACKGROUND

In a typical semiconductor process, multiple mutually exclusive process steps are used to produce separate semiconductor devices. For example, dedicated photolithographic, masking, and ion implantation process steps are often used to produce a resistor structure, such as a polysilicon resistor structure, within a semiconductor process. As another example, dedicated photolithographic masking and ion implantation process steps may be specifically adjusted for production of a capacitor structure in a semiconductor process. These dedicated process steps can increase the cost and cycle time of individual wafers by as much as 5% or more, which can be significant both in terms of product gross margin and fab capacity. Thus, a need exists for systems, methods, and apparatus to address the shortfalls of present technology and to provide other new and innovative features.

SUMMARY

In one general aspect, a semiconductor processing method can include forming an N-type silicon region disposed within a P-type silicon substrate. The method can also include forming a field oxide (FOX) layer in the P-type silicon substrate where the FOX layer includes an opening exposing at least a portion of the N-type silicon region. The method can further include forming a reduced surface field (RESURF) oxide (ROX) layer having a first portion disposed on the exposed N-type silicon region and a second portion disposed on the FOX layer where the ROX layer includes a first dielectric layer in contact with the exposed N-type silicon region and a second dielectric layer disposed on the first dielectric layer. The method can still further include forming a doped polysilicon layer having a first portion disposed on the first portion of the ROX layer and a second portion disposed on the second portion of the ROX layer.

The details of one or more implementations are set forth in the accompanying drawings and the description below. Other features will be apparent from the description and drawings, and from the claims.

BRIEF DESCRIPTION OF THE DRAWINGS

FIGS. 6A through 6M are diagrams that illustrate cross-sectional views of at least some process steps in a semiconductor process.

DETAILED DESCRIPTION

The disclosure herein is related to semiconductor devices that can be produced using one or more process steps within a semiconductor process that overlap or correspond with one or more process steps used to produce other semiconductor devices. For example, a process step that is used to produce a portion of a first semiconductor device (e.g., an active semiconductor device) can also be used to produce a portion of a second semiconductor device (e.g., a passive semiconductor device). In other words, a given process step can be used to produce different portions of different semiconductor devices within an integrated circuit. The given process step, which can be an existing process step that is typically used to produce the portion of the first semiconductor device, may be used, in an unexpected fashion, to produce the portion of the second semiconductor device.

The disclosure herein can be related to processes used to produce a variety of devices including polysilicon resistors, capacitors, bipolar junction transistor (BJT) devices (e.g., NPN BJT devices, PNP BJT devices), complementary metal-oxide semiconductor (CMOS) devices (e.g., P-type metal oxide semiconductor field effect transistor (MOSFET) (PMOSFET or PMOS) devices, N-type MOSFET (NMOSFET or NMOS) devices), laterally diffused metal oxide semiconductor (LDMOS) devices (e.g., N-type LDMOS (LNDMOS) devices, P-type LDMOS (LPDMOS) devices), and/or so forth. A semiconductor process including at least BJT devices, CMOS devices and LDMOS devices can be referred to as a BCDMOS process.

Figure 1:
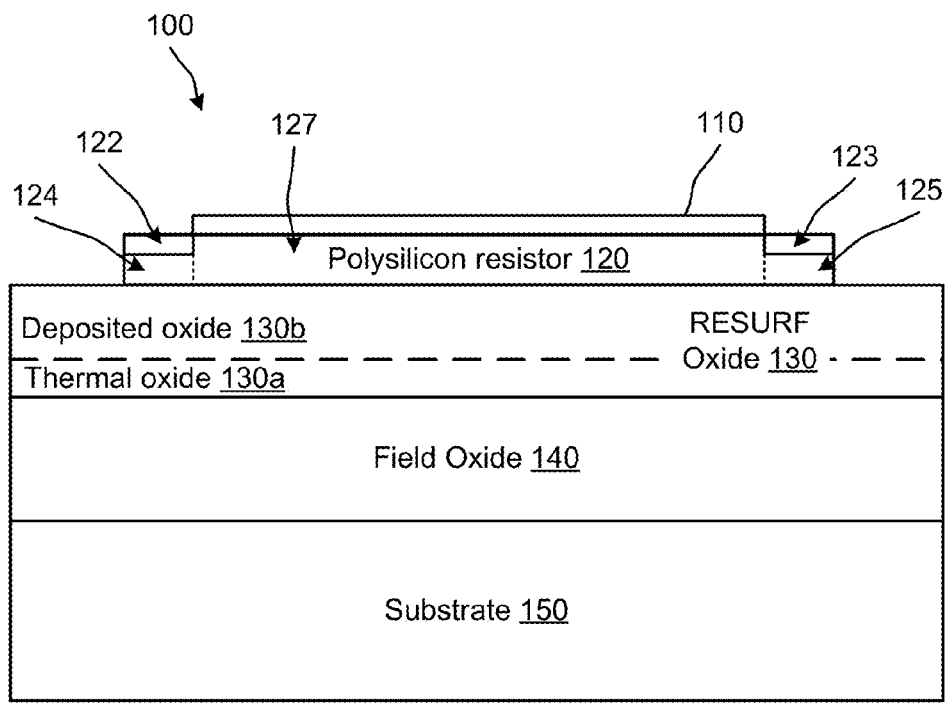
FIG. 1 is a block diagram that illustrates a side cross-sectional view of a resistor structure, according to an embodiment.

FIG. 1 is a block diagram that illustrates a side cross-sectional view of a resistor structure 100, according to an embodiment. The resistor structure 100 can be produced using one or more process steps within a semiconductor process that are typically used to produce other types of semiconductor devices. The one or more process steps are used, in an unexpected fashion, to produce the resistor structure 100.

As shown in FIG. 1, the resistor structure 100 includes a polysilicon resistor 120 disposed on a reduced surface field (RESURF) oxide 130 (also can be referred to as a RESURF oxide layer or an ROX layer). The RESURF oxide layer 130 may include a first oxide (dielectric) layer 130a and a second oxide (dielectric) layer 130b. In the resistor structure 100 shown in FIG. 1, the first oxide layer 130a includes a thermal (thermally-grown) oxide layer and the second oxide layer 130b includes a deposited oxide layer, such as, for example, tetraethylorthosilicate (TEOS). The RESURF oxide 130 may be implemented using other oxides and/or combinations of oxides and various approaches for implementing the RESURF oxide layer 130 are described herein below, e.g., with respect to FIGS. 6A-6M.

In the resistor structure 100, the RESURF oxide layer 130 is disposed on a field oxide 140 (also may be referred to as a field oxide layer or an FOX layer). The field oxide 140 may be disposed on (or in) a silicon substrate 150. In certain embodiments, the field oxide layer 140 may be formed using a local oxidation of silicon (LOCOS) process to oxidize a portion of the silicon substrate 150. In an example embodiment, the RESURF oxide layer 130 is used to form a drift region field dielectric plate (which may also be referred to as a field plate) for a high-voltage LDMOS transistor (e.g., an LNDMOS transistor or an LPDMOS transistor) and is also, used, in an unexpected fashion, in the resistor structure 100. In the resistor structure 100 shown in FIG. 1, the use of the RESURF oxide layer 130 (disposed between the polysilicon resistor 120 and the field oxide 140) results in the polysilicon resistor 120 having a significantly lower parasitic capacitance to the substrate 150 (more than 20% lower) as compared to traditional resistor (polysilicon resistor) structures.

Depending on the particular embodiment, the silicon substrate 150 of the resistor structure 100 may include a well region (regions can also be referred to as implants in some embodiments), which is implanted (e.g., doped) into the substrate 150. In some embodiments, such a well region can be a region including a P-type dopant (e.g., boron (B)) (which can be referred to as a P-type well region or as a P-well region) or can be a region including an N-type dopant (e.g., phosphorus (P), arsenic (As)) (which can be referred to as an N-type well region or as an N-well region). In some embodiments, an implant process (also can be referred to as an implantation process) can include a dopant type (e.g., a dopant have an N-type conductivity type (also can be referred as an N-type dopant), a dopant have a P-type conductivity type (also can be referred as a P-type dopant)), a dopant level (or dose), an angle, a duration, an acceleration, and/or so forth. In some embodiments an N-type conductivity or dopant can be referred to as a first conductivity type or dopant and a P-type conductivity or dopant can be referred to as a second conductivity type or dopant, or vice versa. In other embodiments, the silicon substrate 150 of the resistor structure 100 may include an epitaxial layer (N-type or P-type), a buried layer (N-type or P-type), or a number of other types of silicon substrates.

Also as shown in FIG. 1, the polysilicon resistor 120 (which also can be referred to as a polysilicon layer) includes silicide portions (or layers) 122, 123, and includes doped portions 124, 125. In some embodiments, one or more of the doped portions 124, 125 can include a P-type dopant or an N-type dopant. In some embodiments, the doped portion 124 and/or the doped portion 125 can be heavily doped so that a contact between the silicide portion 122 and/or the silicide portion 123 and the doped portion 124 and/or the doped portion 125 is an ohmic contact as opposed to a rectifying contact. An intrinsic region 127 of the polysilicon 120 is disposed between the doped portions 124, 125 and between the silicide portions 122, 123.

Figure 3:
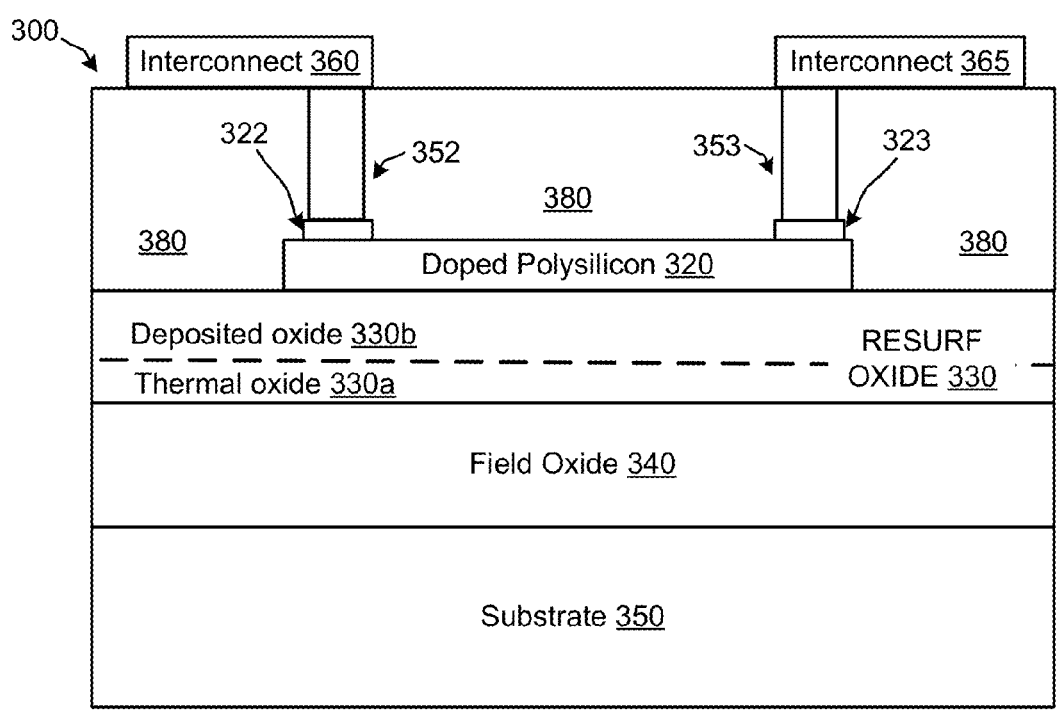
FIG. 3 is a block diagram that illustrates a side cross-sectional view of another resistor structure, according to an embodiment.

In some embodiments, the doped portions 124, 125 can be referred to as contact regions. In some embodiments, the intrinsic region 127 of the polysilicon 120 (which is disposed within a central portion of the polysilicon resistor 120) can be referred to as an intrinsic portion. In other embodiments, the polysilicon resistor 120 may be uniformly heavily doped (to obtain a lower sheet resistance for forming resistor structures with lower resistance values) and the silicide portions 122, 123 may be disposed on the central portion of the polysilicon resistor 120, rather than the doped portions 124, 125, allowing the doped portions 124, 125 to be eliminated. Such an arrangement is illustrated in FIG. 3 and described in further detail below.

An oxide 110, which can be a resistor protection oxide (RPO), a salicide oxide, an inter-layer dielectric or a silicide blocking oxide, is disposed on the intrinsic region 127. In some embodiments, the silicide portions 122, 123 (which can be referred to as salicide (self-aligned silicide) portions) can be self-aligned to the oxide 110.

In FIG. 1, a direction from the substrate 150 to the oxide 110, or from the oxide 110 to the substrate 150 can be referred to as a vertical direction. A direction orthogonal to, or substantially orthogonal to, the vertical direction can be referred to as a horizontal direction or as a lateral direction. A depth along the vertical direction from the oxide 110 (which is oriented toward the top of FIG. 1) to the substrate 150 (which is oriented toward the bottom of FIG. 1) can be a direction of increasing depth. Unless otherwise indicated, the side cross-sectional views described herein are oriented similar to the orientation of FIG. 1, as just described.

As indicated above, the resistor structure 100 is produced using a photolithography/masking step, etching step, and/or an implant step (e.g., a doping step) that is used elsewhere within a semiconductor process to produce other different types of semiconductor devices. In other words, certain process steps (e.g., process steps associated with the RESURF oxide layers 130) within the semiconductor process used to produce other types of semiconductor devices (e.g., high-voltage (HV) LDMOS transistors) can correspond with (e.g., can be performed concurrently with, can be performed simultaneously with) the process steps used to produce the resistor structure 100. This correspondence in process steps can result in efficiencies within the semiconductor process when producing several different types of semiconductor devices and also produce a resistor structure with improved performance characteristics, e.g., lower parasitic capacitance.

In example embodiments, the resistor structure 100 can be produced using one or more other process steps within a semiconductor process that overlap, or correspond with one or more process steps used in a BCDMOS process used to produce BJT devices, CMOS devices, and LDMOS devices. In an example embodiment where the resistor structure 100 is produced within a BCDMOS process, an implant process used to dope a portion of an LDMOS device can be used to dope a portion (or all) of the polysilicon resistor 120. In other words, an implant process used to dope a portion of an LDMOS device can be the same implant process used to concurrently (or simultaneously) dope at least a portion of the resistor structure 100.

Specifically, for the resistor structure 100 shown in FIG. 1, an implant process used to produce a P− region (e.g., a relatively light P-type dopant level) as a body region of an LNDMOS device (e.g., a HV LNDMOS device) can also be used to produce the intrinsic region 127 of the resistor structure 100 (which can be a high-value polysilicon resistor (HVPR)). As another specific example, the doped portions 124, 125 of the polysilicon resister 100 can be produced using an implant process associated with a P+ region (e.g., a relatively heavy concentration of a P-type dopant), which can be the same implant process used to produce the P+ region for a source region and/or a P+ region for a drain region of a PMOS device (e.g., a low-voltage (LV) PMOS device). As yet another example, a silicide process or a salicide process used for CMOS devices, LDMOS devices, and/or BJT devices can also be used to produce the silicide portions 122, 123 of the resistor structure 100.

In some embodiments, an HV LDMOS device (e.g., a HV LNDMOS device, a HV LPDMOS device) or LV MOS device (e.g., a LV PMOS device, a LV NMOS device) can be configured to operate with a voltage (e.g., a breakdown voltage) between 10 V to 100 V (in absolute terms). In some embodiments, an HV LDMOS device or LV MOS device can be configured to operate with voltage less than 10V or a voltage greater than 100 V (in absolute terms). In some embodiments, an HV LDMOS device can be configured to operate with voltage less than 10V or a voltage greater than 100 V (in absolute terms). In some embodiments, a LV LDMOS device (e.g., a LV LNDMOS device, a LV LPDMOS device) or LV MOS device (e.g., a LV PMOS device, a LV NMOS device) can be configured to operate with a voltage (e.g., a breakdown voltage) between 1 V to 8 V (in absolute terms). In some embodiments, a LV LDMOS device or LV MOS device can be configured to operate with voltage less than 1V or a voltage greater than 8 V (in absolute terms). The specific operating voltages and/or breakdown voltages (as well as other device parameters) may depend on the particular technology generation.

In some embodiments, an implant process can be associated with, or can include, additional process steps including a photolithography/masking step, an etching step, and/or an implant step. A process (e.g., an implant process) or process step (e.g., an implant step) that is used to concurrently (or simultaneously) form two separate features of two separate semiconductor devices can be a process or process step that is used to form the two separate features during a concurrent time period (e.g., a first time period overlapping with or corresponding with a second time period), under the same conditions, using the single process or single process step, and/or so forth. This does not preclude additional (e.g., prior, subsequent) process steps to further process (e.g., define, modify) one or more of the features. In some embodiments, a process can be referred to as including a set of process steps.

The cost and cycle time of wafers during a semiconductor process (e.g., a BCDMOS process) can be improved by using existing processes or process steps to produce the resistor structure 100, such as in manners described above. In some embodiments, the cost and cycle time can be improved by as much as 5% or more. The cost and cycle time can be improved because photolithographic/masking, etching, and ion implantation process steps that are dedicated to the production of polysilicon resistors and that have been used for many years to produce polysilicon resistors can be avoided or eliminated from the semiconductor process. Accordingly, existing processes or process steps are being used in unexpected fashions and to achieve beneficial results (e.g., reduced parasitic capacitance) when producing the resistor structure 100, because these existing process steps have not previously been used (e.g., used in a BCDMOS process) to produce a polysilicon resistor structure. In sum, existing process steps of a semiconductor process that are not presently used to produce polysilicon resistors can be efficiently used to produce the polysilicon resistor structure 100. In some embodiments, a process step (e.g., an implantation process step) can be referred to as a step (e.g., an implantation step).

As mentioned above, the resistor structure 100 can be a relatively high-value polysilicon resistor (HVPR), while in other embodiments the resistor structure 100 can be a relatively low-value polysilicon resistor (LVPR). For example, in some embodiments the polysilicon resistor 120 can have a sheet resistance value of between approximately 1000 ohms ($\Omega$) per square (sq) and 5000 $\Omega$/sq (e.g., 1000 $\Omega$/sq, 2000 $\Omega$/sq, 3000 $\Omega$/sq, 4000 $\Omega$/sq, 5000 $\Omega$/sq). In other embodiments, the polysilicon resistor 120 can have a resistance value less than 1000 $\Omega$/sq (e.g., LVPR embodiments) or greater than 5000 $\Omega$/sq (e.g., HVPR embodiments).

Figure 2:
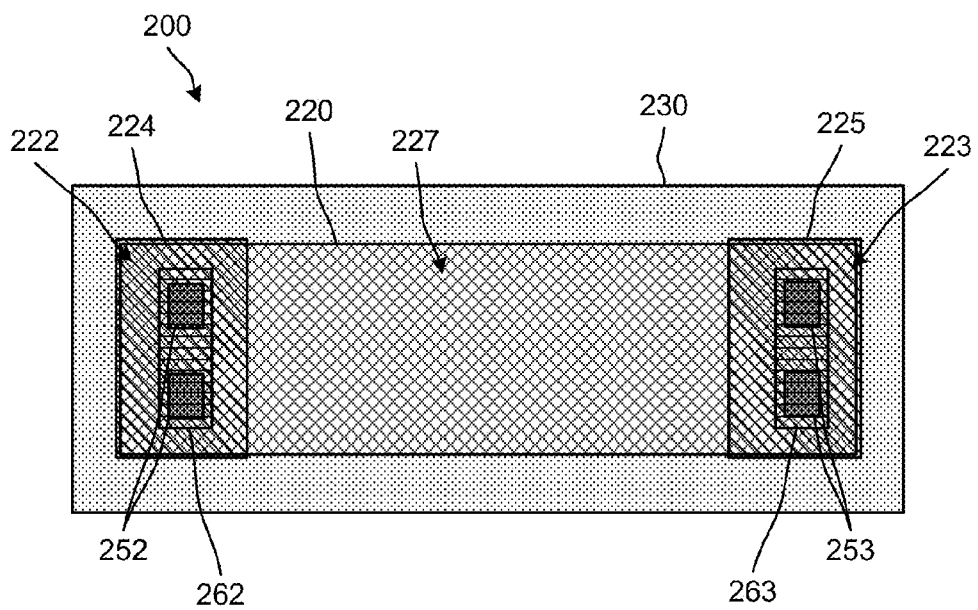
FIG. 2 is a diagram that illustrates a top mask level view of a polysilicon resistor.

FIG. 2 is a diagram that illustrates a top mask level view of a polysilicon resistor structure 200. In an example embodiment, the resistor structure 200 may correspond with the resistor structure 100 shown in FIG. 1, or may correspond with other resistor structures. As shown in FIG. 2, a polysilicon layer 220 is disposed over a RESURF oxide 230 (which is in turn, disposed over a field oxide (not shown) and a silicon substrate (not shown). The polysilicon layer 220 includes an intrinsic region 227 disposed between silicide portions 222, 223 of the polysilicon layer 220. The intrinsic region 227 of the polysilicon layer 220 is also disposed between doped portions 224, 225 of the polysilicon layer 220. As shown in FIG. 2 contacts 252, 253 (or vias) are disposed vertically (into and out of the figure) between the respective silicide portions 222, 223 and metal portions 262, 263 (or layers). In this embodiment, an oxide disposed on the polysilicon layer 220 (such as the oxide 110 described above with respect to FIG. 1) is not shown.

FIG. 3 is a block diagram that illustrates a side cross-sectional view of another resistor structure 300, according to an embodiment. As with the resistor structure 100, the resistor structure 300 can be produced using one or more process steps within a semiconductor process that are typically used to produce other types of semiconductor devices. The one or more process steps are used, in an unexpected fashion, to produce the resistor structure 300.

As shown in FIG. 3, the resistor structure 300 includes a doped polysilicon 320 (which may also be referred to as a doped polysilicon layer) that is disposed on a reduced surface field (RESURF) oxide 330. As with the RESURF oxide layer 130 in FIG. 1, the RESURF oxide layer 330 includes a first oxide (dielectric) layer 330a and a second oxide (dielectric) layer 330b. In the resistor structure 300 shown in FIG. 3, the first oxide layer 330a includes a thermal (thermally-grown) oxide layer and the second oxide layer 330b may includes a deposited oxide layer, such as, for example, TEOS. In other embodiments, other oxides and/or combinations of oxides may be used. Various approaches for implementing such a RESURF oxide layer are described herein below, e.g., with respect to FIGS. 6A-6M.

In the resistor structure 300, the RESURF oxide layer 330 is disposed on a field oxide 340. The field oxide 340 may be disposed on (or in) a silicon substrate 350. In certain embodiments, the field oxide layer 340 may be formed using a local oxidation of silicon (LOCOS) process to oxidize a portion of the silicon substrate 350. In an example embodiment, in like manner as discussed with respect to the RESURF oxide 130, the RESURF oxide layer 330 is used to form a drift region field dielectric plate (which may also be referred to as a field plate) for a high-voltage LDMOS transistor (e.g., an LNDMOS transistor or an LPDMOS transistor) and is also used, in an unexpected fashion, in the resistor structure 300. In the resistor structure 300 shown in FIG. 3, the use of the RESURF oxide layer 330, as with the use of the RESURF oxide layer 130 in the resistor structure 100, results in the doped polysilicon 320 having a significantly lower parasitic capacitance to the substrate 350 (e.g., from 10% to 70% depending on the particular embodiment) as compared to traditional resistor (polysilicon resistor) structures.

Depending on the particular embodiment, the silicon substrate 350 of the resistor structure 300 may include a well region. In other embodiments, the silicon substrate 350 of the resistor structure 300 may include an epitaxial layer (N-type or P-type), a buried layer (N-type or P-type), or a number of other types of silicon substrates.

Also as shown in FIG. 3, the doped polysilicon 320 includes silicide portions (or layers) 322, 323 that, in combination with the (heavily) doped polysilicon 320 may produce ohmic contacts. In this embodiment, the silicide portions 322, 323 may function as electrical contacts to the doped polysilicon 320, which may be electrically connected to other circuit devices using vias 352 and 353 and metal interconnects 360 and 365 when forming the resistor structure 300. The resistor structure 300 also includes an interlayer insulator (dielectric) 380, which may include, in an example embodiment, borophosphosilicate glass (BPSG). The interlayer insulator 380 which may also function as a resistor protection oxide.

The resistor structure 300 (in like manner as the resistor structure 100) is produced using a photolithography/masking step, etching step, and/or an implant step (e.g., a doping step) that is used elsewhere within a semiconductor process to produce other different types of semiconductor devices. In other words, certain process steps (e.g., process steps associated with the RESURF oxide layers 330) within the semiconductor process used to produce other types of semiconductor devices (e.g., high-voltage (HV) LDMOS transistors) can correspond with (e.g., can be performed concurrently with, can be performed simultaneously with) the process steps used to produce the resistor structure 300. This correspondence in process steps can result in efficiencies within the semiconductor process when producing several different types of semiconductor devices and also produce a resistor structure with improved performance characteristics, e.g., lower parasitic capacitance. In example embodiments, as with the resistor structure, 100, the resistor structure 300 can be produced using one or more other process steps within a semiconductor process that overlap, or correspond with one or more process steps used in a BCDMOS process used to produce BJT devices, CMOS devices, and LDMOS devices.

Specifically, for the resistor structure 300 shown in FIG. 3, the doped polysilicon 320 can be produced using an implant process associated with a P+ region (e.g., a relatively heavy concentration of a P-type dopant), which can be the same implant process used to produce the P+ region for a source region and/or a P+ region for a drain region of a PMOS device (e.g., a low-voltage (LV) PMOS device), to produce a LVPR. As yet another example, a silicide process or a salicide process used for CMOS devices, LDMOS devices, and/or BJT devices can also be used to produce the silicide portions 322, 323 of the resistor structure 300. Of course, other process steps that are used to form features of other semiconductor devices may be used to concurrently form features of the resistor structure 300.

As with the resistor structure 100, the cost and cycle time of wafers during a semiconductor process (e.g., a BCDMOS process) can be improved by using existing processes or process steps to produce the resistor structure 300, such as in manners described herein. In some embodiments, the cost and cycle time can be improved by as much as 5% or more. The cost and cycle time can be improved because photolithographic/masking, etching, and ion implantation process steps that are dedicated to the production of polysilicon resistors and that have been used for many years to produce polysilicon resistors can be avoided or eliminated from the semiconductor process.

Accordingly, existing processes or process steps are being used in unexpected fashions and to achieve beneficial results (e.g., reduced parasitic capacitance) when producing the resistor structure 300, because these existing process steps have not previously been used (e.g., used in a BCDMOS process) to produce a polysilicon resistor structure. In sum, existing process steps of a semiconductor process that are not presently used to produce polysilicon resistors can be efficiently used to produce the polysilicon resistor structure 300.

Figure 4:
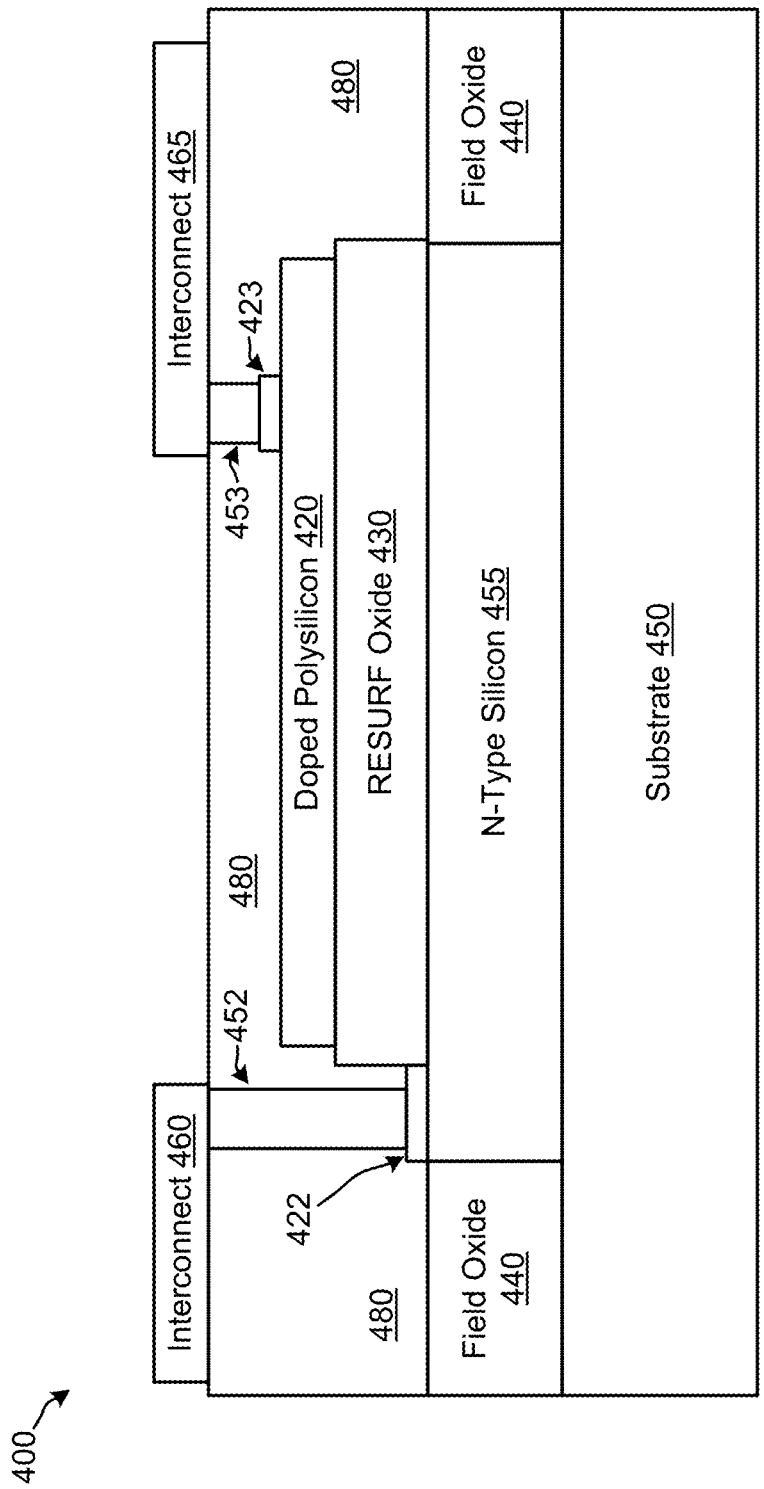
FIG. 4 is a block diagram that illustrates a side cross-sectional view of a capacitor structure, according to an embodiment.

FIG. 4 is a block diagram that illustrates a side cross-sectional view of a capacitor structure 400, according to an embodiment. As with the resistor structures 100 and 300, the capacitor structure 400 can be produced using one or more process steps within a semiconductor process that are typically used to produce other types of semiconductor devices. The one or more process steps are used, in an unexpected fashion, to produce the capacitor structure 400.

As shown in FIG. 4, the capacitor structure 400 includes a doped polysilicon (layer) 420 that is disposed on a reduced surface field (RESURF) oxide 430. The doped polysilicon 420 may be used as a top (upper) conductive plate in the capacitor structure 400.

For the capacitor structure 400 shown in FIG. 4, the doped polysilicon 420 can be produced using an implant process associated with a P+ region (e.g., a relatively heavy concentration of a P-type dopant), which can be the same implant process used to produce the P+ region for a source region and/or a P+ region for a drain region of a PMOS device (e.g., a low-voltage (LV) PMOS device), in order to produce the upper conductive plate of the capacitor structure 400 with a low resistance value.

Also in the capacitor structure 400, the RESURF oxide layer 430 may be produced using the techniques described herein (e.g., may include multiple oxide/dielectric layers). The RESURF oxide layer 430 is used as a dielectric layer (e.g., between two conductive plates) of the capacitor structure 400. In an example embodiment, in like manner as discussed with respect to the RESURF oxide layers 130 and 330, the RESURF oxide layer 430 is used to form a drift region field dielectric plate (which may also be referred to as a field plate) for a high-voltage LDMOS transistor (e.g., an LNDMOS transistor or an LPDMOS transistor) and is also used, in an unexpected fashion, in the capacitor structure 400. In the capacitor structure 400 shown in FIG. 4, the use of the RESURF oxide layer 430 in an unexpected fashion to produce the capacitor's dielectric layer allows for the production of a capacitor structure with a breakdown voltage between 30V and 200V (as compared to breakdown voltages between 5V and 20V). Of course, other process steps that are used to form features of other semiconductor devices may be used to concurrently form features of the capacitor structure 400.

In the capacitor structure 400, the RESURF oxide layer 430 is disposed on an N-type silicon region 455. The RESURF oxide layer 430 may be produced using a number of different approaches, such as those described herein. For example, the RESURF oxide 430 may be a same RESURF oxide as the RESURF oxides 130 and/or 330. In the capacitor structure 400, the N-type silicon region 455 is used as a bottom (lower) conductive plate, and may be formed in a number of ways, such as those described herein. For instance, the N-type silicon region 455 may include an N-well region, a high-voltage N-well region, a buried N-type silicon layer and a highly doped N-type silicon region, such as those produced using the process steps discussed below with respect to FIGS. 6A through 6M.

As shown in FIG. 4, the N-type silicon region 455 is disposed between field oxide regions 440. In certain embodiments, the N-type silicon region 455 may be disposed within an opening in the field oxide 440, where the opening in the field oxide 440 defines a perimeter within which the N-type silicon region 455 is exposed (e.g., for subsequent formation of the RESURF oxide layer 430).

As shown in FIG. 4, the N-type silicon region 455 and the field oxide 440 may be disposed within a silicon substrate 450. In certain embodiments, the field oxide 440 may be formed using a local oxidation of silicon (LOCOS) process to oxidize a portion of the silicon substrate 450, where the opening in the field oxide 440 is produced using a nitride (blocking) mask to block (prevent) the formation of field oxide in the area of the N-type silicon region 455.

Depending on the particular embodiment, the silicon substrate 450 of the capacitor structure 400 may include a P-type silicon substrate. For instance, the silicon substrate 450 may include at least one of a P-type epitaxial layer and a P-type buried layer or other substrate type. Various embodiments for producing (providing) the silicon substrate 450 are discussed below with respect to FIGS. 6A through 6M.

Also as shown in FIG. 4, the N-type silicon region 455 and the doped polysilicon 420 include silicide portions (or layers) 422, 423, respectively that produce ohmic contacts. In an example embodiment, a silicide process or a salicide process used for CMOS devices, LDMOS devices, and/or BJT devices can also be used to produce the silicide portions 422, 423 of the capacitor structure 400. In this embodiment, the silicide portions 422, 423 may function as electrical contacts to the doped polysilicon 420 and the N-type silicon region 455, which may be electrically connected to other circuit devices using vias 452 and 453 and metal interconnects 460 and 465 when forming the capacitor structure 400. The capacitor structure 400 also includes an interlayer insulator (dielectric) 480, which may include, in an example embodiment, borophosphosilicate glass (BPSG). The interlayer insulator 480 which may also function as a capacitor protection oxide.

The capacitor structure 400 (in like manner as the resistor structures 100 and 300) is produced using a photolithography/masking step, etching step, and/or an implant step (e.g., a doping step) that is used elsewhere within a semiconductor process to produce other different types of semiconductor devices. In other words, certain process steps (e.g., process steps associated with the RESURF oxide layers 430) within the semiconductor process used to produce other types of semiconductor devices (e.g., high-voltage (HV) LDMOS transistors) can correspond with (e.g., can be performed concurrently with, can be performed simultaneously with) the process steps used to produce the capacitor structure 400. This correspondence in process steps can result in efficiencies within the semiconductor process when producing several different types of semiconductor devices and also produce a resistor structure with improved performance characteristics, e.g., lower parasitic capacitance. In example embodiments, the capacitor structure 400 can be produced using one or more other process steps within a semiconductor process that overlap, or correspond with one or more process steps used in a BCDMOS process used to produce BJT devices, CMOS devices, and LDMOS devices.

As with the resistor structures 100 and 300 (and others described herein), the cost and cycle time of wafers during a semiconductor process (e.g., a BCDMOS process) can be improved by using existing processes or process steps to produce the capacitor structure 400, such as in manners described herein. In some embodiments, the cost and cycle time can be improved by as much as 5% or more. The cost and cycle time can be improved because photolithographic/masking, etching, and ion implantation process steps that are dedicated to the production of polysilicon resistors and that have been used for many years to produce polysilicon resistors can be avoided or eliminated from the semiconductor process.

Accordingly, existing processes or process steps are being used in unexpected fashions and to achieve beneficial results (e.g., increased breakdown voltage) when producing the capacitor structure 400, because these existing process steps have not previously been used (e.g., used in a BCDMOS process) to produce a capacitor structure. In sum, existing process steps of a semiconductor process that are not presently used to produce capacitor structures can be efficiently used to produce the capacitor structure 400.

Figure 5:
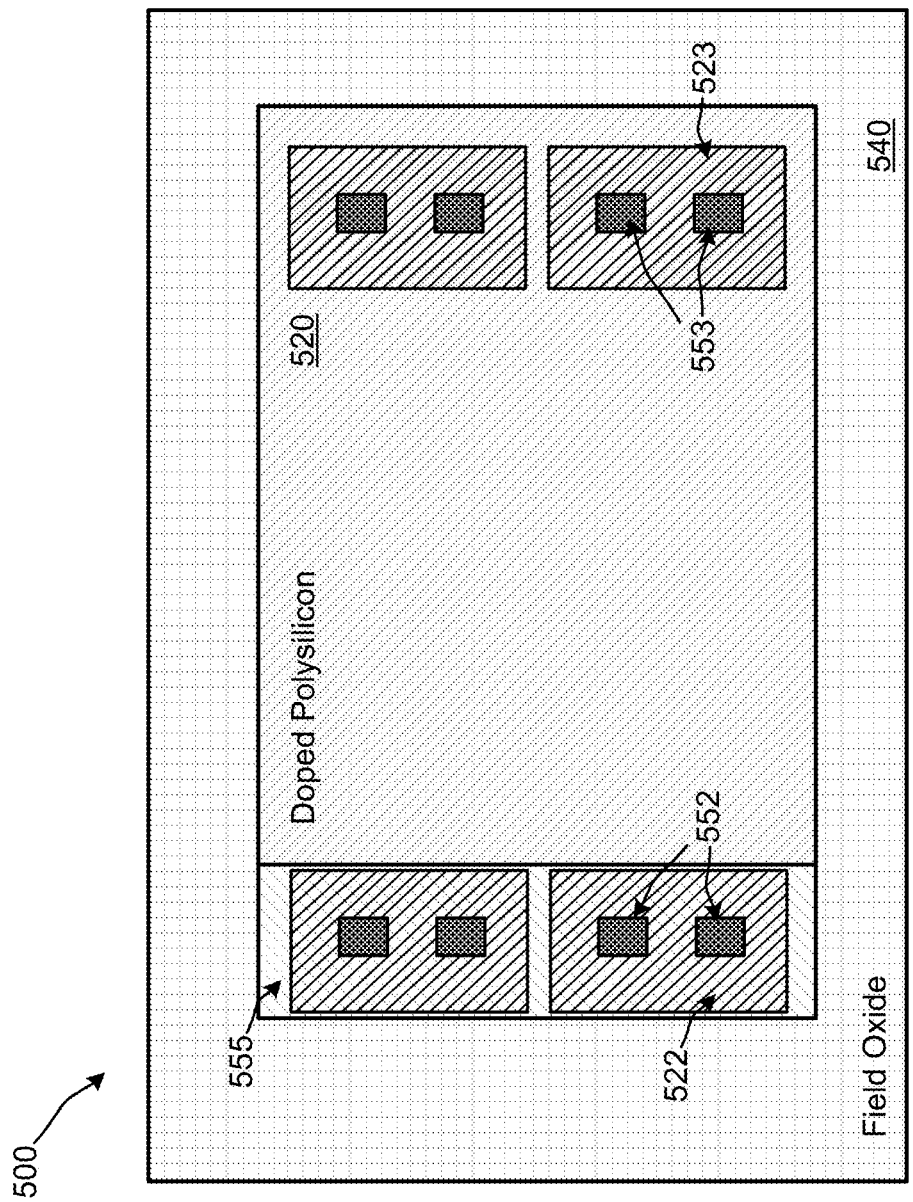
FIG. 5 is a diagram that illustrates a top mask level view of a capacitor structure.

FIG. 5 is a diagram that illustrates a top mask level view of a capacitor structure 500, according to an embodiment. In an example implementation, the capacitor structure 500 may correspond with the capacitor structure 400 shown in FIG. 4, or may correspond with other capacitor structures. As shown in FIG. 5, a doped polysilicon layer 520 is disposed over a RESURF oxide (not shown). The RESURF oxide is, in turn, disposed over an N-type silicon region 555. The N-type silicon region is exposed through an opening in a field oxide 540, such as discussed herein. The polysilicon layer 520 and the N-type silicon region 555 include silicide portions 522 and 523. As shown in FIG. 5 contacts 552, 553 (or vias) are disposed vertically (into and out of the figure) between the respective silicide portions 522, 523 and metal portions (or interconnect layers), such as the interconnect layers 460 and 465 shown in FIG. 4. In this embodiment, a dielectric disposed on the capacitor structure 500 (such as the dielectric 480 described above with respect to FIG. 4) is not shown.

Figure 6A:
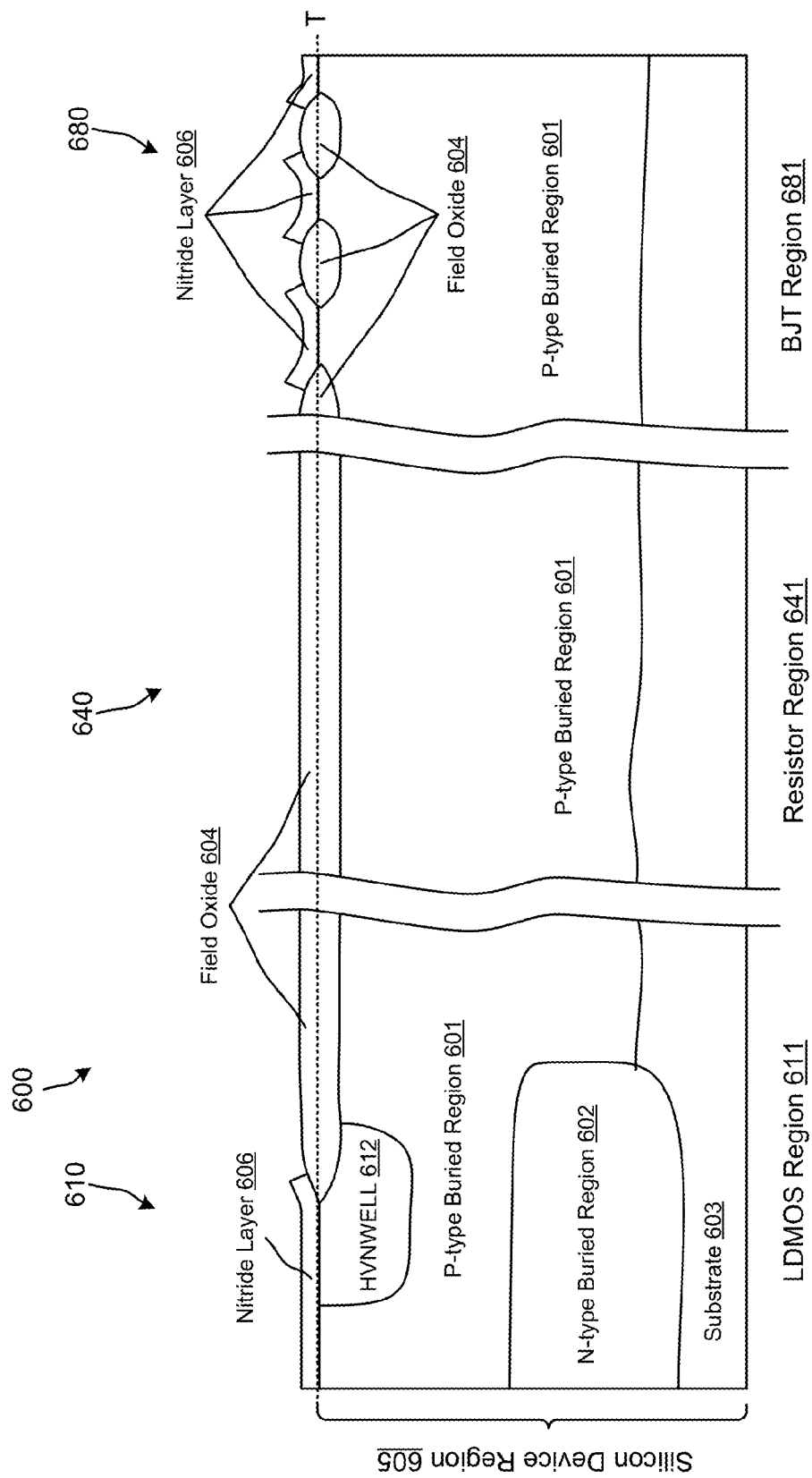
Figure 6F:
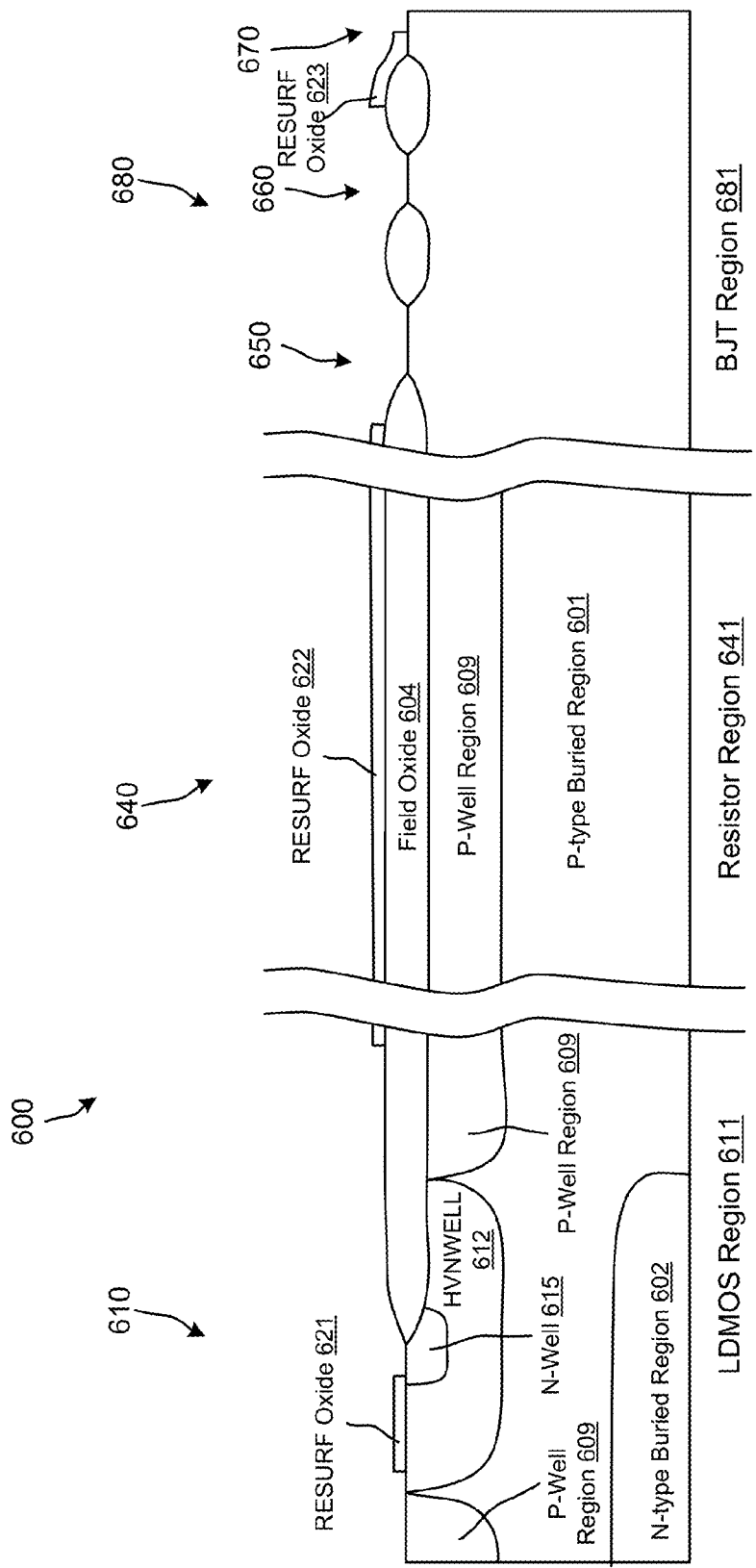
Figure 6G:
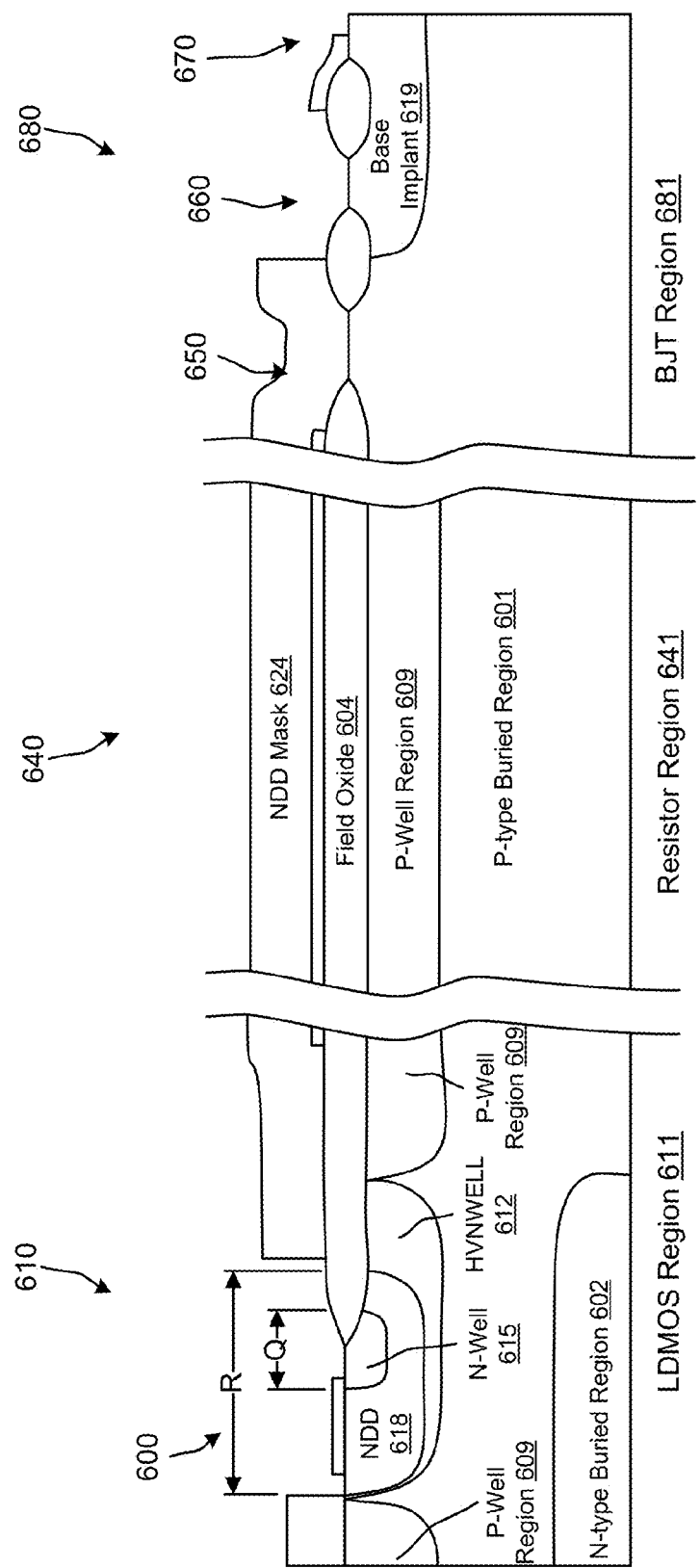
Figure 6H:
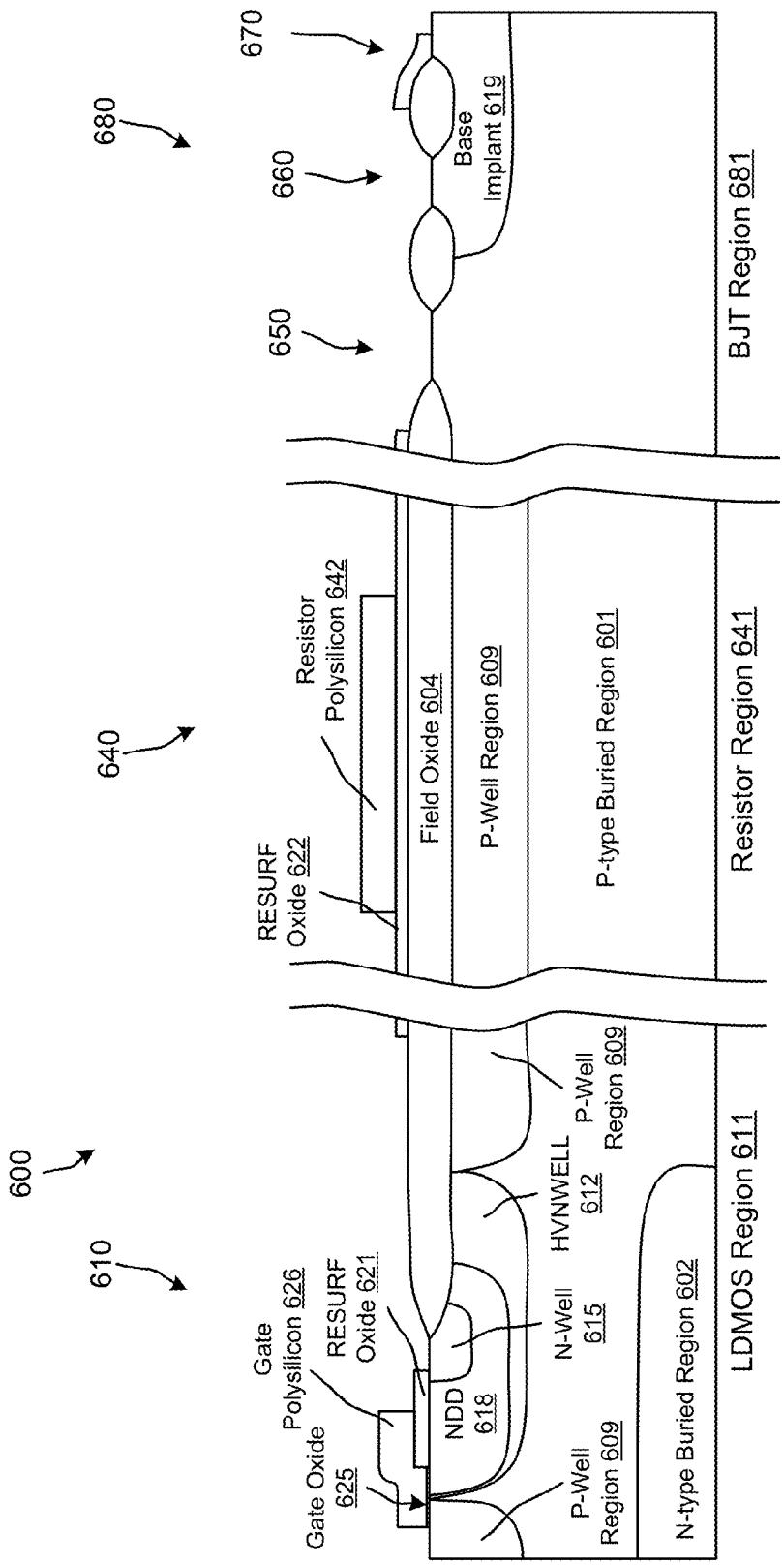
Figure 6I:
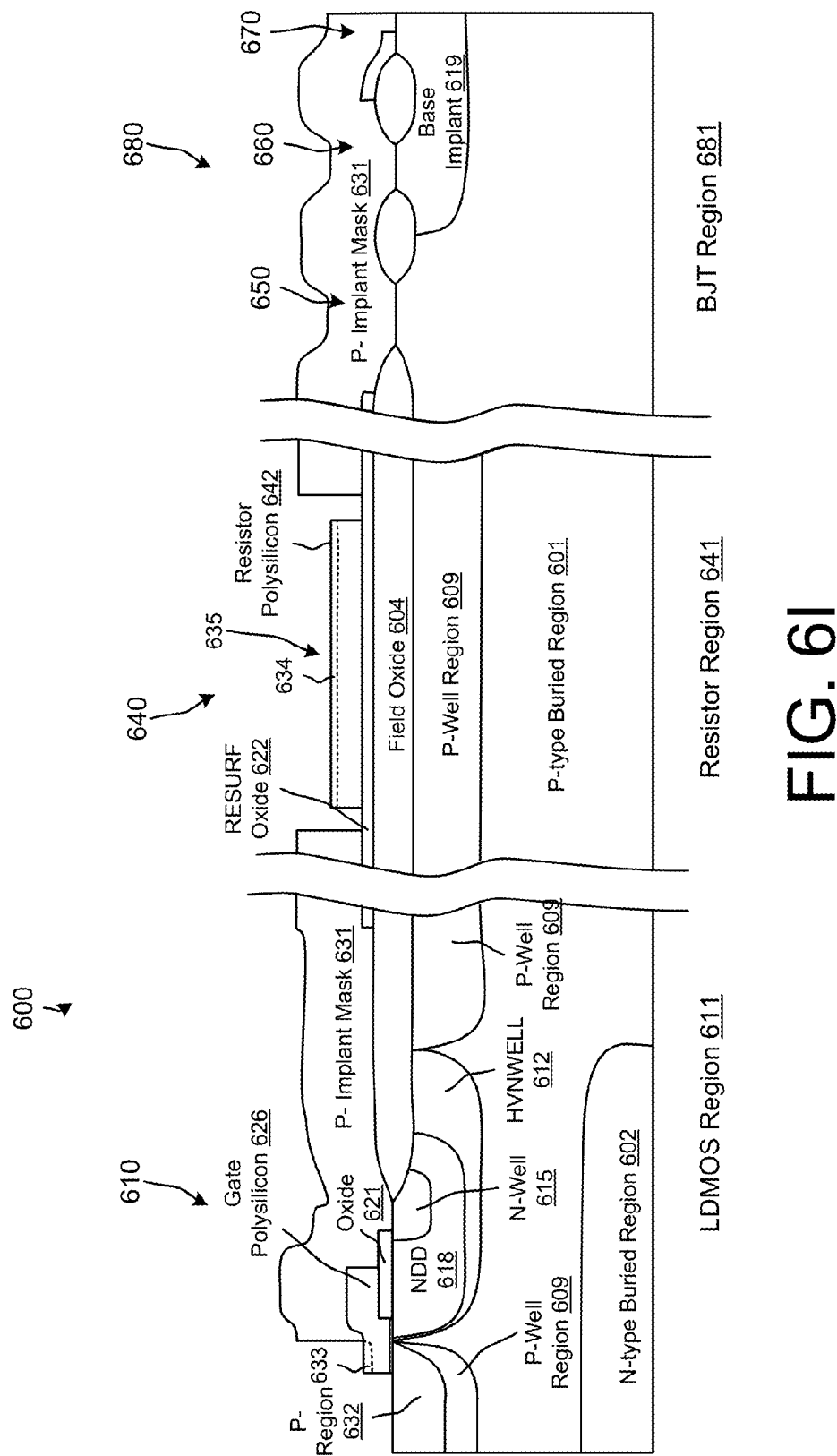
Figure 6J:
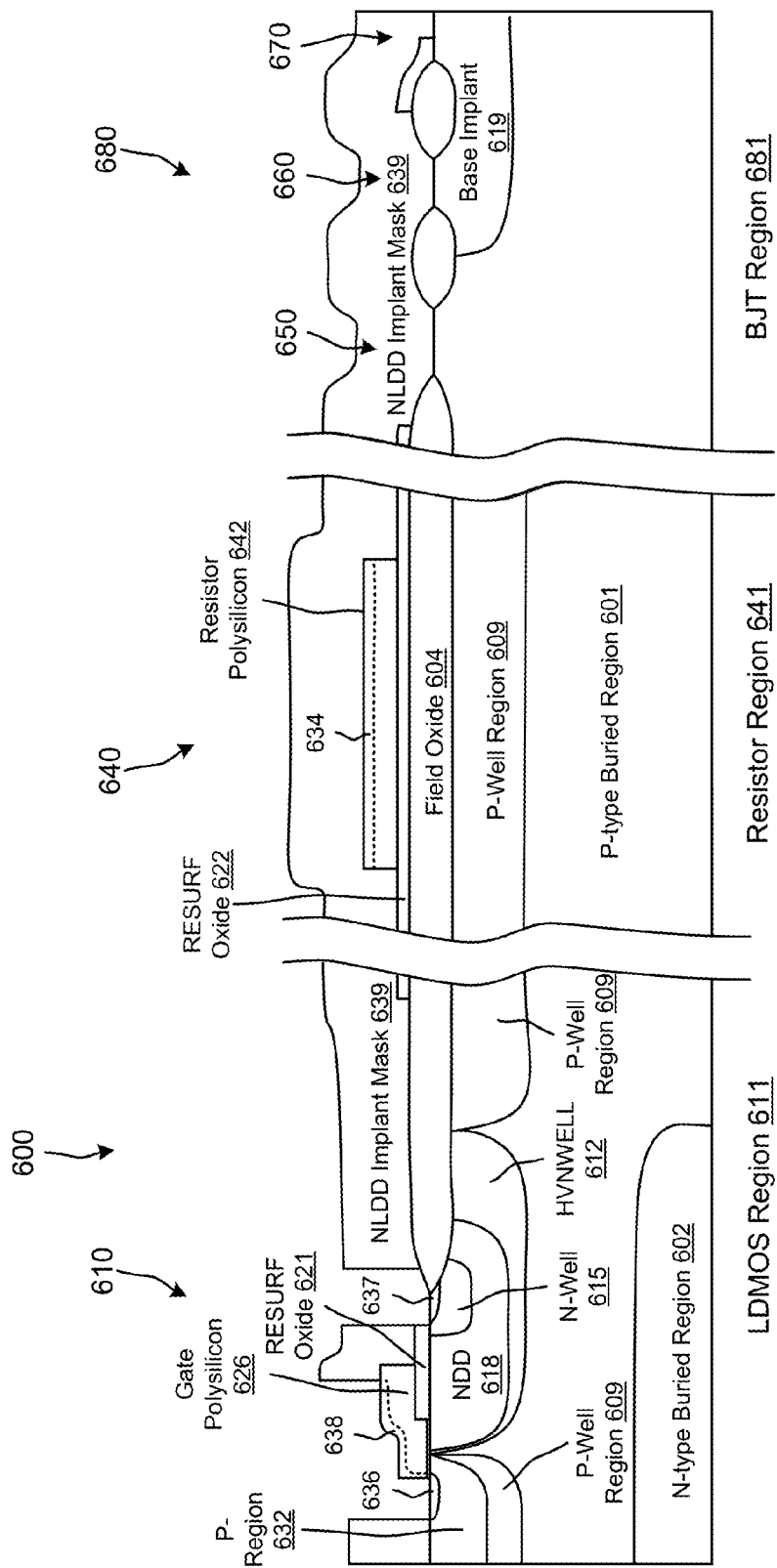
Figure 6K:
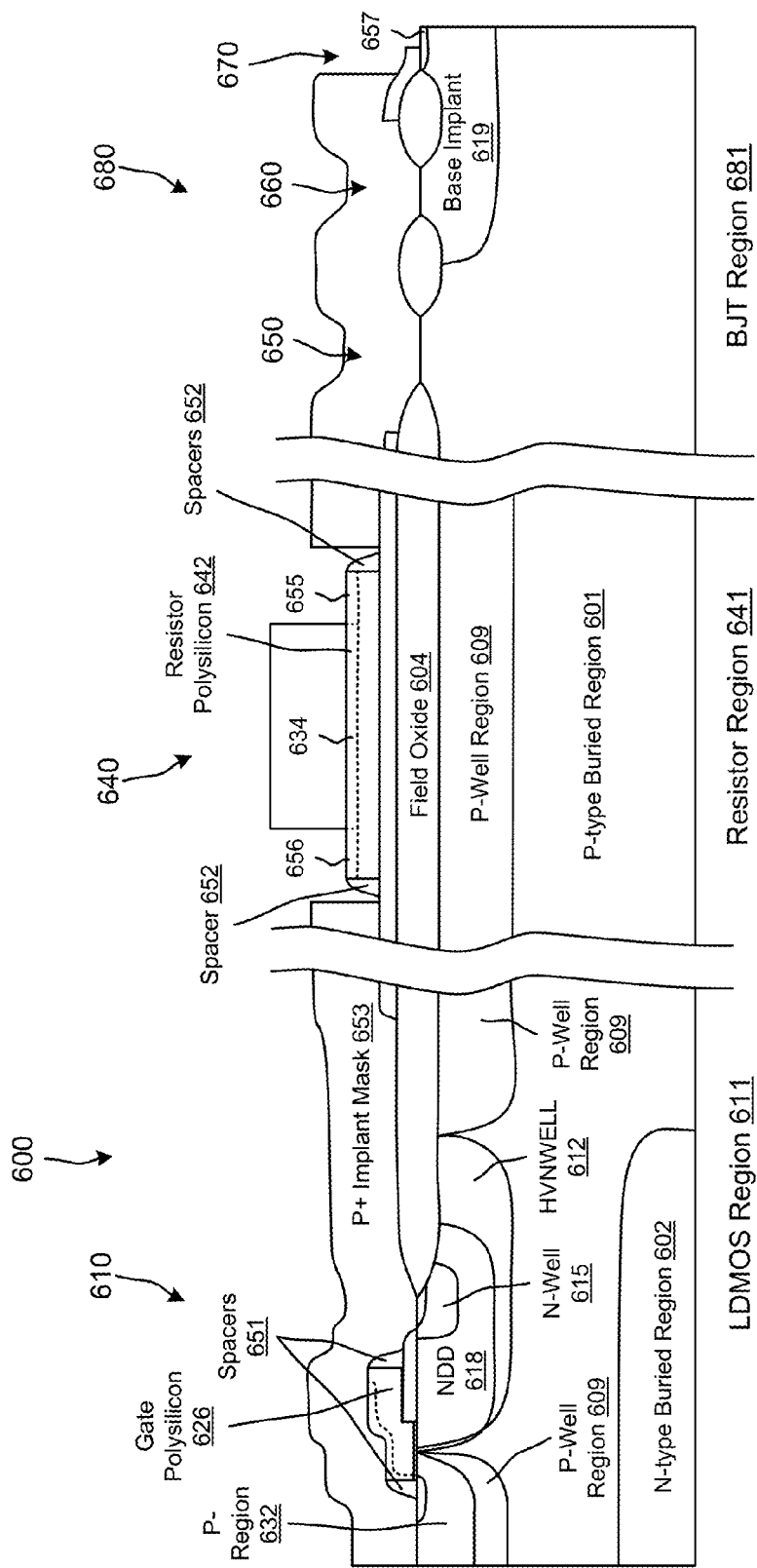
Figure 6L:
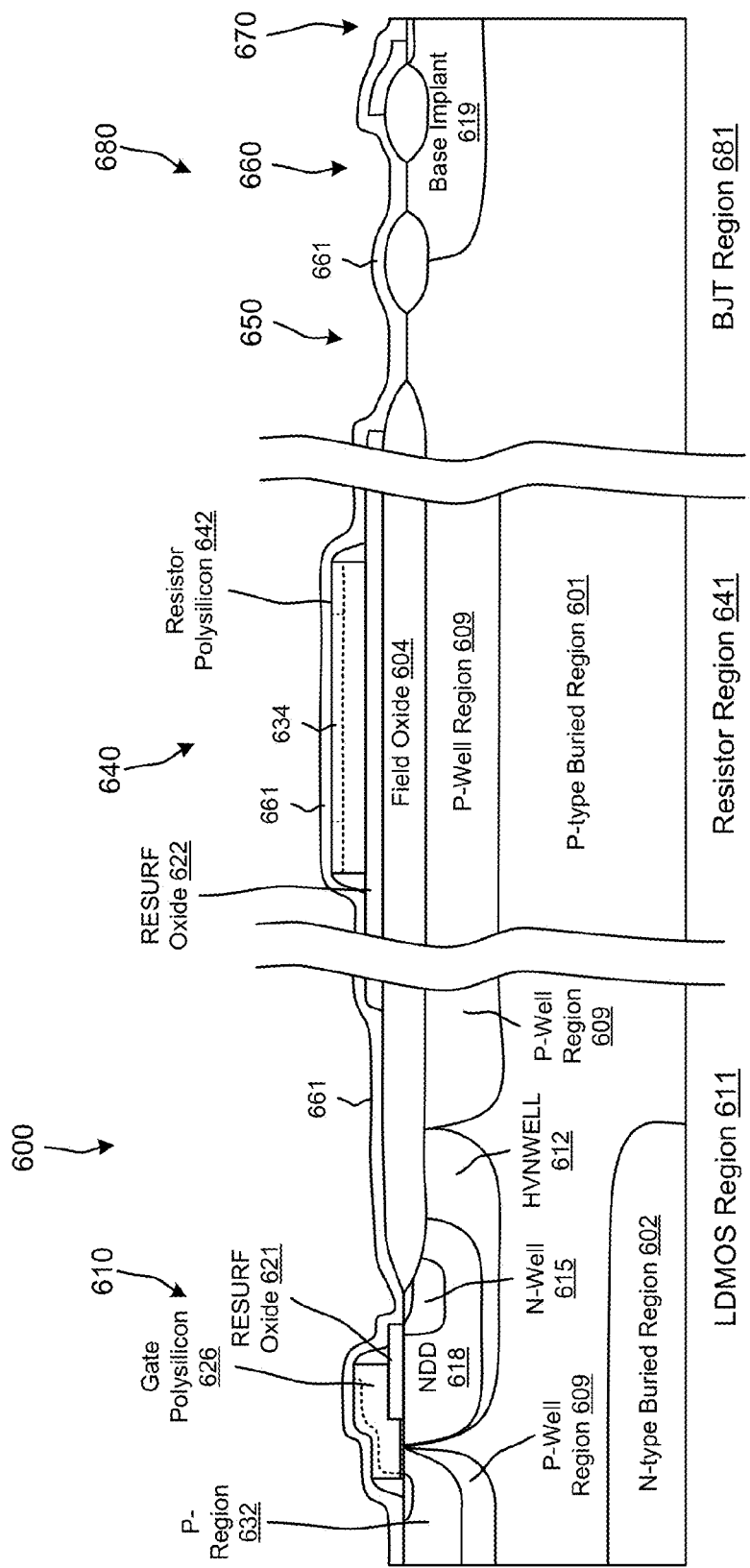
Figure 6M:
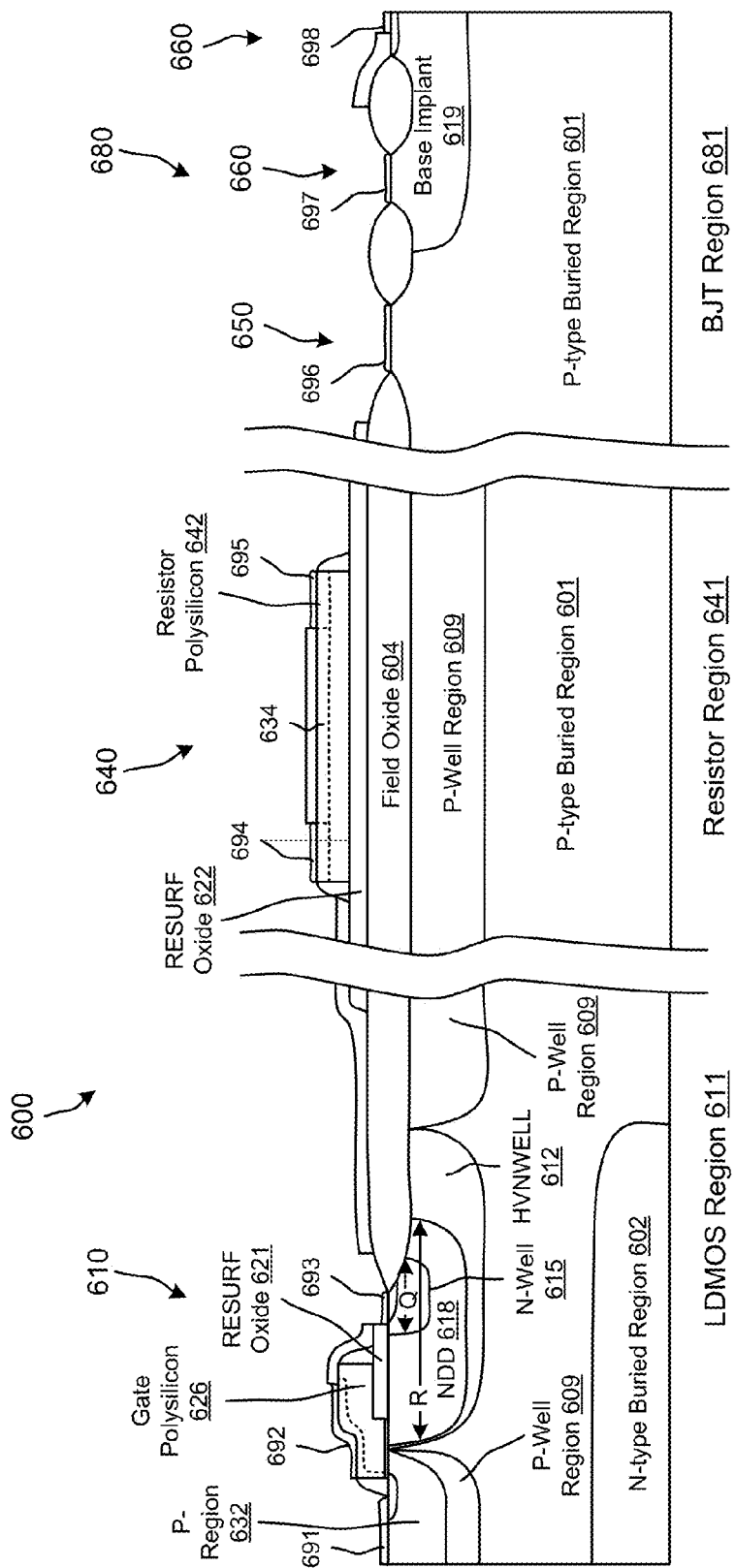
Figure 7:
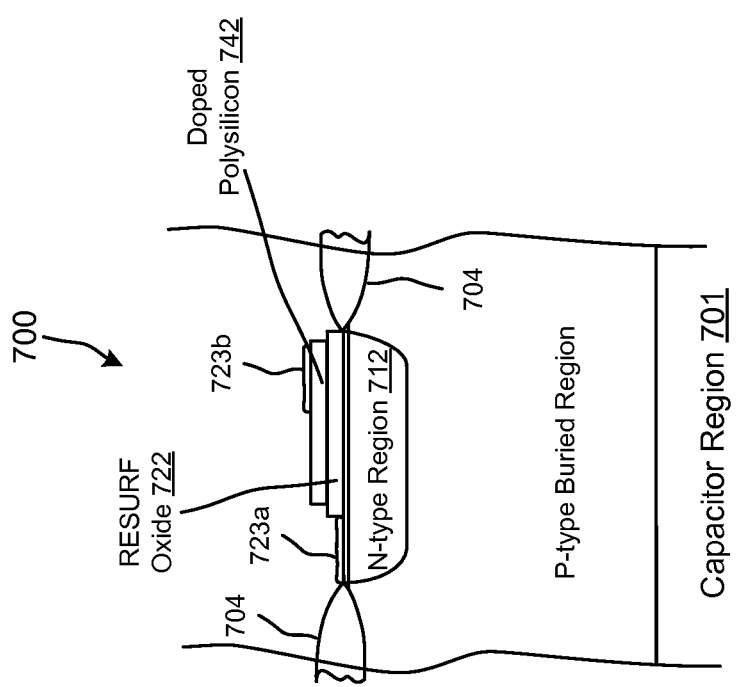
FIG. 7 is a diagram that illustrates a cross-sectional view of a capacitor structure that may be formed using the semiconductor process illustrated in FIGS. 6A through 6M.

FIGS. 6A through 6M are diagrams that illustrate cross-sectional views of at least some process steps in a semiconductor process that can be used to produce an LDMOS device 610 (e.g., a HV LDMOS device, an LNDMOS device), a polysilicon resistor 640, and/or a BJT device 680 (each shown as devices in FIG. 6M). Additionally, the process steps illustrated in FIGS. 6A through 6M may also be used to produce a capacitor structure 700, as illustrated in FIG. 7, in a capacitor region 701 at a same time that the LDMOS device 610, the polysilicon resistor 640 and the BJT device 680 are produced. Accordingly, for purposes illustration and clarity, the capacitor structure 700 of FIG. 7 will be described in conjunction with the discussion of FIGS. 6A through 6M.

Specifically, in this embodiment, portions of the polysilicon resistor 640 the capacitor 700 and/or the BJT device 680 can be produced using one or more process steps within a semiconductor process overlapping or corresponding with one or more process steps used to produce the LDMOS device 610. The LDMOS device 610, the polysilicon resistor 640 and the BJT device 680 are integrated in a device 600 (also can be referred to as an integrated circuit). In other embodiments, the capacitor structure 700 shown in FIG. 7 may also be integrated in the device 600.

In the device 600, the LDMOS device 610 is produced within an LDMOS region 611 of the device 600, the polysilicon resistor 640 is produced within a resistor region 641 of the device 600, and the BJT device 680 is produced within a BJT region 681 of device 600. As shown in FIG. 6M, the BJT device 680 includes a collector 650, a base 660, and an emitter 670. As indicated above, the capacitor 700 may be produced with the capacitor region 701 shown in FIG. 7.

While FIGS. 6A through 6M are cross-sectional diagrams that illustrate process steps of a BCDMOS process, the techniques described herein can be applied in a variety of semiconductor processes. The sequence of process steps depicted by the cross-sectional views shown in FIGS. 6A through 6M are given by way of example.

Accordingly, various process steps are simplified and/or intermediate process steps are not shown. In some embodiments, at least some of the process steps described herein can be performed in a different order than shown. Also, not all of the elements will be re-labeled with references numerals in each of the figures to simplify the figures. In some embodiments, the oxides described herein can include, or can be, any combination of dielectrics including a low-k dielectric, a silicon dioxide, a thermally grown oxide, a deposited oxide, and/or so forth.

As shown in FIG. 6A, the device 600 includes a substrate 603 and an N-type buried region 602 disposed between the substrate 603 and a P-type buried region 601 in the LDMOS region 611. The P-type buried region 601 and the N-type buried region 602 can be formed using a series of process steps including implantation process steps, oxidation process steps, epitaxial growth steps, and/or so forth. In some embodiments, at least a portion of the N-type buried region 602 and the P-type buried region 601 can be formed in one or more epitaxial layers (e.g., P-type epitaxial layers) that are serially formed (e.g., formed in a stack fashion, formed above one another during different time periods with intervening process steps or layers). For example, a first P-type epitaxial layer can be formed on the substrate 603 and a second P-type epitaxial layer can be formed on the first P-type epitaxial layer. The epitaxial layers can have thicknesses between approximately 0.5 μm to 3 μm. In some embodiments, one or more of the epitaxial layers can have a thickness less than approximately 0.5 μm or greater than approximately 3 μm. In some embodiments, the epitaxial layers can have different thicknesses.

The epitaxial layer(s), if formed on the substrate 603, and the substrate 603 can collectively be referred to as a silicon device region 605. A top surface T of the silicon device region 605 is illustrated with a dashed line in FIG. 6A. The top surface T of the silicon device region 605 can be a substantially planar top surface T that is horizontally aligned, and a vertical direction can be substantially normal to the top surface T. Although the top surface T and the silicon device region 605 may not be shown in each of the figures, these features are referred to in the subsequent figures.

As shown in FIG. 6A, a high voltage N-well (HVNWELL) region 612 is formed in the P-type buried region 601. In some embodiments, the HVNWELL region 612 can be formed using an HVNWELL photolithography process and an N-type implant process (e.g., an HVNWELL implantation process).

If two epitaxial layers are formed on the substrate 603 with a first epitaxial layer disposed between a second epitaxial layer and the substrate 603, the HVNWELL region 612 can have a depth approximately equal to a depth of the second epitaxial layer, which is disposed on the first epitaxial layer. In some embodiments, the HVNWELL region 612 can have a depth that is less than the depth of the second epitaxial layer, or can have a depth that exceeds the depth of the second epitaxial layer so that at least a portion of the HVNWELL region 612 is disposed in the first epitaxial layer. In some embodiments, at least a portion of the HVNWELL region 612 can be disposed in the substrate 630.

In this embodiment, after the HVNWELL region 612 has been formed, a nitride layer 606 is formed. Portions of the nitride layer 606 are formed in the LDMOS region 611 and portions of the nitride layer 606 are formed in the BJT region 681 (e.g., portions between collector, base, and emitter). The nitride layer 606, in some embodiments, can be a deposited layer, and can be formed using a variety of processing steps including photolithography process steps, etching steps, and/or so forth.

After the nitride layer 606 has been formed, a field oxide 604 is formed. The field oxide 604 can have portions that are in contact with, or disposed below, at least some of the portions of the nitride layer 606. As shown in FIG. 6A, at least a portion of the field oxide 604 can be disposed above the top surface T of the silicon device region 605 and at least a portion of the field oxide 604 can be disposed below the top surface T of the silicon device region 605. In some embodiments, the field oxide 604 can be formed as a local oxidation of silicon (LOCOS) using a LOCOS process. In some embodiments, the field oxide 604 can have a thickness of between 2000 Angstroms (Å) and 6000 Å (e.g., 3000 Å, 4500 Å, 5000 Å). Although not shown in FIG. 6A, in some embodiments, a buffer oxidation, a pad oxidation, sacrificial oxidations and/or so forth can be performed. The nitride layer 606 can be referred o as a blocking mask for formation of the field oxide 604, as the nitride layer 606 blocks (prevents) the formation of the field oxide 604. The nitride layer 606 may also be used when forming the capacitor structure 700 shown in FIG. 7 (or the capacitor structures 400 and 500 discussed above), such as to prevent formation of a field oxide 704 in an N-type silicon region 712 (which can be formed prior to, or subsequent to forming the field oxide 704). The N-type silicon region 712, in the capacitor structure 700, is configured to operate as one of two conductive plates of the capacitor structure 700.

FIG. 6B is a cross-sectional diagram illustrating the device 600 after the nitride layer 606 has been removed. After the nitride layer 606 is been removed, a P-well (blocking) mask 608 (or portions thereof) can be formed on at least some portions of the device 600. Portions of the device 600 that are unmasked with (or exposed through) the P-well mask 608 will be doped with a P-type dopant to form one or more P-well regions 609, which are shown in FIG. 6C. As shown in FIG. 6B, the P-well mask 608 is formed over at least some portions of the LDMOS region 611 and over at least some portions of the BJT region 681. The P-well regions 609 can be formed using a P-well implant in addition to other types of implants including an anti-punchthrough (APT) implant, an N-threshold voltage (NVT) implant, a deep isolation implant, and/or so forth. Throughout this description, a mask (e.g., blocking mask) can be, or can include, a photoresist or other material, such as nitride for example.

As shown in FIG. 6C, several of the P-well regions 609 are formed in the LDMOS region 611 lateral to the HVNWELL region 612 so that the HVNWELL region 612 is disposed between P-well regions 609 (e.g., disposed between two P-well region 609). Also, as shown in FIG. 6C, the P-well region 609 (e.g., another portion of the P-well region 609) is formed below the field oxide 604 and the resistor region 641. Accordingly, the P-well region 609 has at least a portion disposed between the field oxide 604 and the P-type buried region 601 in the resistor region 641. Although not shown in FIG. 6B, in some embodiments, at least some portions of the P-well mask 608 may be formed on at least some portions of the resistor region 641, so that at least some portions of the P-well region 609 may not be formed below the field oxide 604. In some embodiments, a different type of P-type region can be formed within the P-type buried region 601 of the resistor region 641. Similarly, though not shown in FIG. 7, at least some other portions of the P-well mask 608 may be formed on at least some portions of a capacitor region 701 (in which the capacitor structure 700 is formed) to prevent formation of the P-well region in the capacitor region 701.

In some embodiments, the P-well implant process used to form the P-well region 609 can be used to form a P-well region in a base of a BJT device (not shown) (e.g., a NPN BJT device). In this embodiment, the P-well implant process used to form the P-well region 609 is not used to form the base 660 of the BJT device 680. In some embodiments, the P-well doping or implant process can be used to form at least a portion of the BJT device 680.

FIG. 6D is a cross-sectional diagram illustrating formation of an N-well mask 613 (or portions thereof) on at least some portions of the device 600. Portions of the device 600 (e.g., the LDMOS region 611) that are unmasked with (or exposed through) the N-well mask 613 will be doped with an N-type dopant to form one or more N-well regions 615. In this embodiment, an N-well region 615 is formed within the HVNWELL region 612 of the LDMOS region 611. The N-well region(s) 615 can be formed using an N-well implant in addition to other types of implants including an APT implant, a P-threshold voltage (PVT) implant, and/or so forth. In certain embodiments, the N-well mask may also be formed in at least portions of the capacitor region 701 shown in FIG. 7 to block formation of the N-well region 615. In some embodiments, the N-type silicon region 712 of the capacitor structure 700 may include an N-well region 615 that is formed in similar fashion as illustrated by, and described with respect to FIG. 6D. In other embodiments, the N-type region 712 may be formed using other processes or process steps of a semiconductor process, such as those described with respect to FIGS. 6A-6M.

In some embodiments, the N-well implant process used to form the N-well region 615 can be used to form an N-well region in a base of a BJT device (not shown) (e.g., a PNP BJT device). In this embodiment, the N-well implant process used to form the N-well region 615 is not used to form a doped region in the base 660 of the BJT device 680. In other words, the N-well doping or implant process is excluded from the BJT device 680. In some embodiments, the N-well doping or implant process can be used to form at least a portion of the BJT device 680.

As shown in FIG. 6E, a RESURF oxide 620 is formed on the device 600. In some embodiments, the RESURF oxide 620 can be any combination of a thermal oxide and a deposited oxide. In some embodiments, the RESURF oxide 620 can include a deposited oxide layer disposed on a thermally-grown oxide layer, or vice versa. In some embodiments, the thermal oxide can have a thickness of between approximately 10 Å and 1000 Å, and the deposited oxide can have a thickness of between approximately 10 Å and 1500 Å. For example, the RESURF oxide 620 can include a thermal oxide of approximately 200 Å and a deposited oxide of approximately 800 Å. In some embodiments, the RESURF oxide may include a deposited oxide layer disposed on a thermally-grown oxide layer, where the deposited oxide layer has a thickness that is at least four times that of a thickness of the thermally-grown oxide layer. Although not shown in FIG. 6E, in some embodiments, a sacrificial oxide formed on the device 600 can be removed before the RESURF oxide 620 is formed on the device 600. In an embodiment, the RESURF oxide 620 may be used to form a field plate for the LDMOS device 600 and also used, in an unexpected fashion, to form a feature of the resistor 640 (or the resistor structures 100, 200, 300) and/or a feature the capacitor 700 (or the capacitor structures 400, 500), such as using the approaches described herein.

FIG. 6F is a cross-sectional diagram that illustrates the device 600 after at least some portions of the RESURF oxide 620, which is shown in FIG. 6E, have been removed to form RESURF oxides 621, 622, 623 (or portions of RESURF oxide or a RESURF oxide layer). In some embodiments, portions of the RESURF oxide 620 can be removed using one or more masking processes and/or one or more etching processes. As shown in FIG. 6F, at least a portion of the RESURF oxide 622 is disposed on the field oxide 604 in the resistor region 641. Also, at least some portions of the RESURF oxide 623 are disposed on the emitter 670 of the BJT device 680 included in the BJT region 681. Specifically, at least a portion of the RESURF oxide 622 is disposed on an exposed silicon surface (e.g., an exposed silicon surface (e.g., top surface T) of the silicon device region 605) of the emitter 670 in the BJT region 681. Also, although not labeled, a remaining portion of the RESURF oxide 620 is disposed on at least a portion of the collector 650. Further, as shown in FIG. 7, at least a portion of a RESURF oxide 722 (after the removal process of FIG. 6F) may be disposed on the N-type silicon region 712 of the capacitor 700, where the RESURF oxide 722 is configured to function as a dielectric of the capacitor structure 700.

Also, as shown in FIG. 6F, a portion of the RESURF oxide 621 (which is derived from RESURF oxide 620) is disposed on an exposed silicon surface (e.g., an exposed silicon surface of the silicon device region 605) of the LDMOS device 610 in the LDMOS region 611 (e.g., to form a drift region field plate for the LDMOS device 610). Specifically, a portion of the RESURF oxide 621 is disposed on the HVNWELL region 612 and on the N-well region 615.

FIG. 6G is a cross-sectional diagram that illustrates formation of N-type doped drift (NDD) regions 618 concurrently formed with a base implant region 619 within the device 600. Specifically, NDD region 618 is formed in the HVNWELL region 612, and the base implant region 619 is concurrently (e.g., simultaneously) formed in the BJT region 681. The NDD region 618 may be formed using multiple implant operations that are performed at different energies. The NDD region 618 can function as a drift region of the LDMOS device 610 in the LDMOS region 611. The NDD region 618 and the base implant region 619 are formed using an NDD mask 624, and an N-type implant process (e.g., a single N-type implant process). In certain embodiments, the n-type region 712 of the capacitor 700 may include an NDD region 618.

As shown in FIG. 6G, the N-type implant process used to form the NDD region 618 in the LDMOS device 610 of the LDMOS region 611 is the same N-type implant process used to form the base implant region 619 included in the base 660 of the BJT region 681. Accordingly, as shown in FIG. 6G, during at least the masking step and implanting step for the NDD region 618 (e.g., the N-type drift region), the base 660 and the emitter 670 of the BJT device 680 is also opened (e.g., exposed, unmasked) in the NDD mask 624 (which can be referred to as a drift region mask) and implanted.

As also shown in FIG. 6G, the NDD region 618 and the base implant region 619 each have a depth that is greater than (e.g., 1.05 times greater than, two times greater than) a depth of the N-well region 615. As shown in FIG. 6G, the NDD region 618 and the base implant region 619 have a lateral (or horizontal) width R (from left to right, or vise versa) greater than a lateral (or horizontal) width Q of the N-well region 615.

Although not shown in FIG. 6G, PDD regions can also be formed in a similar fashion for an HVLPDMOS device or HVPMOS device (not shown) and an NPN BJT device (not shown). The P-type implant used for the PDD region of the HVLPDMOS device or HVPMOS device can also be used to dope a base of the NPN BJT device. The PDD region of the HVLPDMOS device or HVPMOS device can function as a drift region of the HVLPDMOS device or HVPMOS device. In other words, in an NPN BJT device (not shown) a P-type drift region implant can be used to dope the NPN BJT device, and a P-well doping or implant can be excluded from at least one NPN BJT device.

As mentioned above, in some embodiments, in addition to BJT devices formed using the drift region implants (e.g., BJT device 680), one or more BJT devices (not shown) can be produced with base implant regions formed using a P-well process (for an NPN BJT device) and one or more BJT devices (not shown) can be produced with base implant regions formed using an N-well process (for an PNP BJT device).

FIG. 6H is a cross-sectional diagram that illustrates formation of polysilicon portions on the device 600. As shown in FIG. 6H, a gate polysilicon 626 (which also can be referred to as a gate electrode) is formed in the LDMOS region 611 and a resistor polysilicon 642 (also can be referred to as a polysilicon portion) is formed in the resistor region 641. In certain embodiments, the doped polysilicon 742 of the capacitor 700 may be formed at the same time (e.g., using the same process steps) as the gate polysilicon 626 and the resistor polysilicon 642. In some embodiments, the gate polysilicon 626, the resistor polysilicon 642 and the doped polysilicon 742 can be formed as part of a polysilicon layer. Accordingly, in some embodiments, the gate polysilicon 626, the resistor polysilicon 642 and the doped polysilicon 742 can be formed as part of the same polysilicon formation process.

Specifically, in some embodiments, a polysilicon deposition process used to form the gate polysilicon 626 can be the same as a polysilicon deposition process used to form the resistor polysilicon 642 and the doped polysilicon 742. Accordingly, the resistor polysilicon 642, the gate polysilicon 626 and the capacitor 700's doped polysilicon 742 can be concurrently formed, rather than formed using different polysilicon process steps. In some embodiments, the polysilicon deposition process can include one or more masking process steps, one or more etching steps, and/or so forth.

As shown in FIG. 6H, the resistor polysilicon 642 is disposed on the RESURF oxide 622, which is disposed on the field oxide 604. Accordingly, the RESURF oxide 622 and the field oxide 604 are disposed between the resistor polysilicon 642 and the P-well region 609, which results in a reduction in parasitic capacitance associated with the resistor structure 600 as compared with traditional polysilicon resistors.

Further, as is shown in FIG. 7, the doped polysilicon 742 is disposed on the RESURF oxide 722, which is disposed on the N-type region 712. The structure of the capacitor 700 shown in FIG. 7, (as with the capacitor 400) allows for the formation of high-voltage capacitors with breakdown voltages between 20V and 300V, as compared with breakdown voltages between 5V and 20V for current capacitors implemented in semiconductor processes.

In this embodiment, the BJT region 681 is excluded from polysilicon formation. Although not shown in FIG. 6H, in some embodiments, the resistor polysilicon 642 can be formed directly on the field oxide 604. In such embodiments, the RESURF oxide 622 may not be formed on (e.g., may be excluded from) at least a portion of the field oxide 604 in the resistor region 641. In other words, in some embodiments, the RESURF oxide 622 may not be disposed between the field oxide 604 and the resistor polysilicon 642.

As shown in FIG. 6H, a gate oxide 625 is formed below at least a portion of the gate polysilicon 626 (so that the gate oxide 625 is disposed between the gate polysilicon 626 and the top surface T of the silicon device region 605). As shown in FIG. 6H, the gate oxide 625 is in contact with at least a portion of the RESURF oxide 621. Specifically, an end of the gate oxide 625 is in contact with (e.g., abuts, is adjacent to) at least an end of the RESURF oxide 621. In some embodiments, the gate oxide 625 can have a thickness between 5 Å and 425 Å (e.g., 50 Å, 120 Å, 200 Å, 300 Å, 400 Å), or thicker. In some embodiments, the gate oxide 625 can have a thickness that is less than a thickness of the RESURF oxide 621.

As shown in FIG. 6H, a boundary (e.g., a left-side boundary as oriented in this figure) of the NDD region 618 intersects (e.g., terminates at) an interface between the top surface T of the silicon device region 605 (which can be a top surface of an epitaxial layer) and a bottom surface of the gate oxide 625 of the LDMOS device 610. In contrast, a boundary (e.g., a left-side boundary as oriented in this figure) of the N-well region 615 can intersect an interface between the top surface T of the silicon device region 605 (which can be a top surface of an epitaxial layer) and a bottom surface of the RESURF oxide 620 of the LDMOS device 610. As shown in FIG. 6H, a boundary of the NDD region 618 (below the gate oxide 625) can be approximately the same as (e.g., corresponds with or is adjacent to) a boundary of the HVNWELL region 612.

As shown in FIG. 6H, the N-well region 615 is disposed within the NDD region 618, which is disposed within the HVNWELL region 612, and the HVNWELL region 612 is disposed between (e.g., laterally between) portions of P-well region 609. Accordingly, the N-well region 615, the NDD region 618, and the HVNWELL region 612 have different cross-sectional areas.

As shown in FIG. 6H, a boundary (e.g., a right-side boundary as oriented in this figure) of the NDD region 618 intersects (e.g., terminates at) an interface between the field oxide 604 and the silicon device region 605. In other words, the boundary (e.g., a right-side boundary as oriented in this figure) of the NDD region 618 terminates at a bottom surface of the field oxide 604. Similarly, a boundary (e.g., a right-side boundary as oriented in this figure) of the N-well region 615 also intersects (e.g., terminates at) an interface between the field oxide 604 and the silicon device region 605. In other words, the boundary (e.g., a right-side boundary as oriented in this figure) of the N-well region 615 terminates at a bottom surface of the field oxide 604. As shown in FIG. 6H, a boundary (e.g., right-side boundary as oriented in this figure) of the NDD region 618 (below the gate oxide 625) does not correspond with (e.g., is separate from) a boundary (e.g., right-side boundary as oriented in this figure) of the N-well region 615 or a boundary (e.g., right-side boundary as oriented in this figure) of the HVNWELL region 612.

FIG. 6I is a cross-sectional diagram that illustrates a P-implant mask 631 used to form P– region 632 (which can be the body region of the LNDMOS device 610) and used to dope at least a portion 633 of the gate polysilicon 626, at least a portion 634 of the resistor polysilicon 642 and at least a portion of the doped polysilicon 742 of the capacitor structure 700 illustrated in FIG. 7. The P-region 632 is disposed within the P-well region 609. A depth of the P-region 632 is less than a depth of the P-well region 609. As shown in FIG. 6I, the implantation process used to dope the P-region 632 is also used to dope a portion 633 of the gate polysilicon 626, the portion 634 of the resistor polysilicon 642 and may be used to dope the doped polysilicon 742 of the capacitor structure 700. Accordingly, the portion 634 of the resistor polysilicon 642 and the doped polysilicon 742 can be concurrently doped with the portion 633 of the gate polysilicon 626 and the P-region 632. The doping of the P-region 632 and portions 633, 634 and doped polysilicon 742 can be a relatively light doping (e.g., lighter in concentration than a concentration of the P-well region 609) performed using a P-type dopant, or can be of a higher doping concentration, depending on the particular embodiment. At least a portion (e.g., a middle portion along a top portion) of the portion 634 can define an intrinsic region 635 of the resistor polysilicon 642. In other words, during the LDMOS device 610 body implant, the P-implant mask can be opened (e.g., exposed, unmasked) around the resistor polysilicon 642 so that the resistor polysilicon 642 can be doped. The P– region 632 is disposed within at least one portion of the P-well region 609.

The portion 634 of the resistor polysilicon 642 can include at least some portions of the intrinsic region 635 of the resistor polysilicon 642. Examples of an intrinsic region of a polysilicon resistor are shown and described above in connection with at least FIGS. 1 and 2. In some embodiments, the P-implant mask 631 (which can be referred to as a body implant mask) can be formed so that only the intrinsic region 635 of the resistor polysilicon 642 is doped. The P− region 632 can have a dopant concentration that is lower than (e.g., an order of magnitude lower than) a dopant concentration of the P-well region 609.

In some embodiments, the resistor polysilicon 642 and the doped polysilicon 742 of the capacitor 700 can be doped with the same implant process (or steps thereof) used to dope the P-region 632 as well as an N-type implant used to dope a source of the LDMOS device 610. In some embodiments, the source implant can be formed during a source/drain (S/D) implantation related to an NMOS process.

FIG. 6J is cross-sectional diagram illustrating N-type lightly doped drain (NLDD) regions 636, 637 formed using an NLDD implant mask 639. As shown in FIG. 6J, at least a portion 638 of the gate polysilicon 626 is also doped during the NLDD implant process (which, in certain embodiments, may also be used to dope the doped polysilicon 742 of the capacitor structure 700). Although not shown in FIG. 6J, a P-type LDD implant can also be performed. In some embodiments, the gate seal oxidation process (not shown) can be performed before an NLDD implant process is performed and/or before a PLDD implant process is performed. As shown in FIG. 6J, the resistor region 641 and the BJT region 681 are excluded from the NLDD implant process. In some embodiments, at least some portions of the resistor region 641 and/or the BJT region 681 can be exposed to the NLDD implant. For example, at least a portion of (e.g., an intrinsic region of) the resistor polysilicon 642 can be exposed to the NLDD implant.

As shown in FIG. 6K, a TEOS deposition and etch to form spacers 651 for the LDMOS device 610 and spacers 652 for the polysilicon resistor 640 are performed. The spacers 651 and the spacers 652 can be formed using a spacer etch back process.

After the spacers 651, 652 have been formed, each end of the resistor polysilicon 642 is doped with a P+ implant process (which is a type of source implant process and/or drain implant process) using a P+ implant mask 653 (which can be referred to as a source mask and/or as a drain mask) to form P+ regions 655, 656. The P+ implant mask can be associated with a P+ source/drain (S/D) implant of a PMOS device (not shown). The ends (or contact regions) of the resistor polysilicon 642 can be further doped with a P-type dopant so that ohmic (rather than rectifying) contacts can be later formed using (or via) the P+ regions 655, 656 of the polysilicon resistor 640. As shown in FIG. 6K, end portions of the resistor polysilicon 642, which have been previously doped, are unmasked with (or exposed through) the P+ implant mask 653 to form the P+ regions 655, 656. In some embodiments, the P+ regions can be referred to as contact regions of the polysilicon resistor 640. The intrinsic region 635 (shown in FIG. 6I, for example) can be disposed between the P+ regions 655, 656. In some embodiments, the process steps used to dope the ends (P+ regions 655, 656) of the resistor polysilicon and the S/D regions of a PMOS device may also be used to dope the doped polysilicon 742 of the capacitor 700.

Also, as shown in FIG. 6K, the emitter 670 of the BJT device 680 is doped with the P+ implant to form a P+ region 657 within the base implant region 619. Accordingly, at least some portions of the polysilicon resistor 640 and at least some portions of the BJT device 680 can be concurrently doped with a P+ implantation process associated with a PMOS device.

In this embodiment, the P+ implant only is shown. In some embodiments, an N+ source/drain implant associated with an NMOS device (not shown) can also be performed. Although not shown in this embodiment, at least some portions of a polysilicon resistor (not shown), at least some portions of an NPN BJT device (not shown) and at least some portions of the doped polysilicon 742 of the capacitor structure 700 (not shown) can be concurrently doped with an N+ implantation process associated with an NMOS device.

After the P+ implant process has been performed, as shown in FIG. 6L, a salicide blocking oxide 661 is formed (e.g., deposited, grown) on the device 600. In some embodiments, the salicide blocking oxide 661 can be referred to as a salicide oxide. The salicide blocking oxide 661 may then be patterned, such that the salicide blocking oxide 661 is removed except in areas of the device 600 where the formation of salicide is not desired, such as the central P− doped portion of the resistor polysilicon 642. After patterning the salicide blocking oxide 661, a metal layer (not shown) may be formed on the device 600. This metal layer may then be reacted (e.g., with silicon in contact with the metal layer) as part of a salicide process. Accordingly, during salicide processing, salicide is formed on the P+ regions 655, 656 of the resistor polysilicon 642, but is not formed on the intrinsic, central P− doped portion of the resistor polysilicon 642 that is disposed between the P+ regions 655, 656 (which is doped with the LNDMOS P-type body implant).

Similarly, the salicide oxide 661 can be etched (patterned) so that salicide 691, 692, and 693 can be formed, respectively, on the gate, source, and drain of the LDMOS device 610 as shown in FIG. 6M. Also, salicide 694 and 695 can be formed on each end (on the P+ regions 655 and 656, respectively) of the polysilicon resistor 640, as well as forming salicide 723a, 723b for the capacitor structure 700. Finally, salicide 696, 697, 698, can be formed, respectively, on each of the collector 650, base 660, and emitter 670, of the BJT device 680. Process steps subsequent to formation of the salicide such as contact formation, passivation, metallization (e.g., interconnect), dielectric and via formation, are not shown.

In some embodiments, additional types of semiconductor structures can be included in the device 600. For example, a capacitor device, such as the capacitor structure 700, can be formed in the device 600 in addition to the BJT device 680, the polysilicon resistor 640, and the LDMOS device 610. In other embodiments, other configurations may be used for the various device features described above. For instance, the resistor polysilicon 642 may be uniformly (e.g., heavily) doped rather than having heavily doped ends 655, 656 and a relatively lightly doped intrinsic (central) region 635.

Figure 8A:
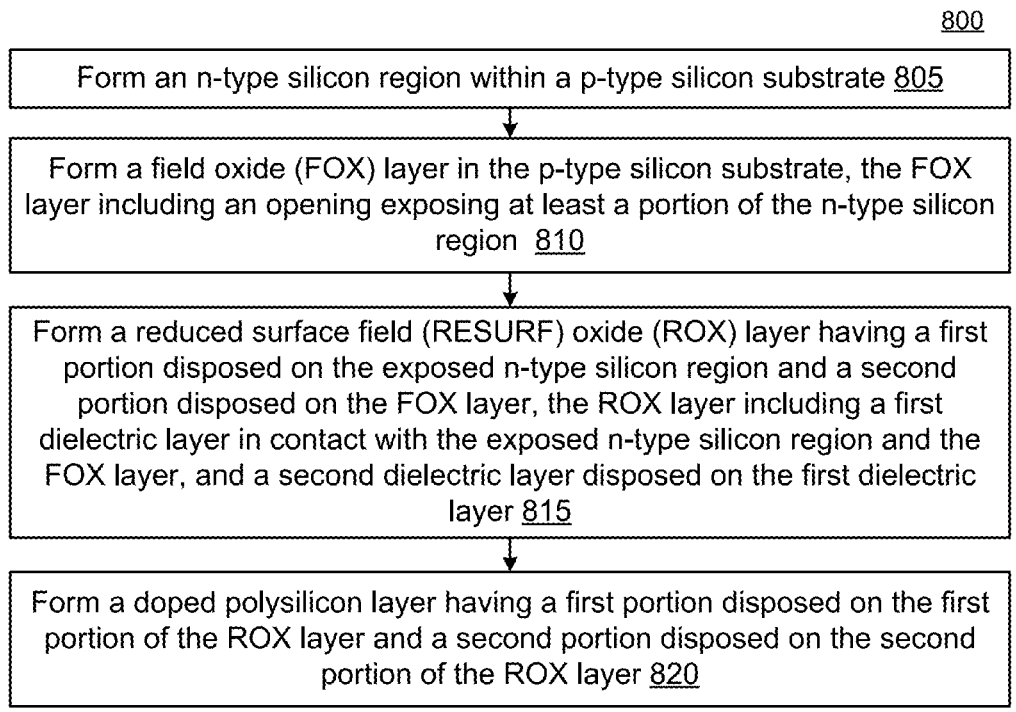
FIGS. 8A, 8B and 8C are flowcharts that illustrate methods for semiconductor processing, according to an embodiment.
Figure 8B:
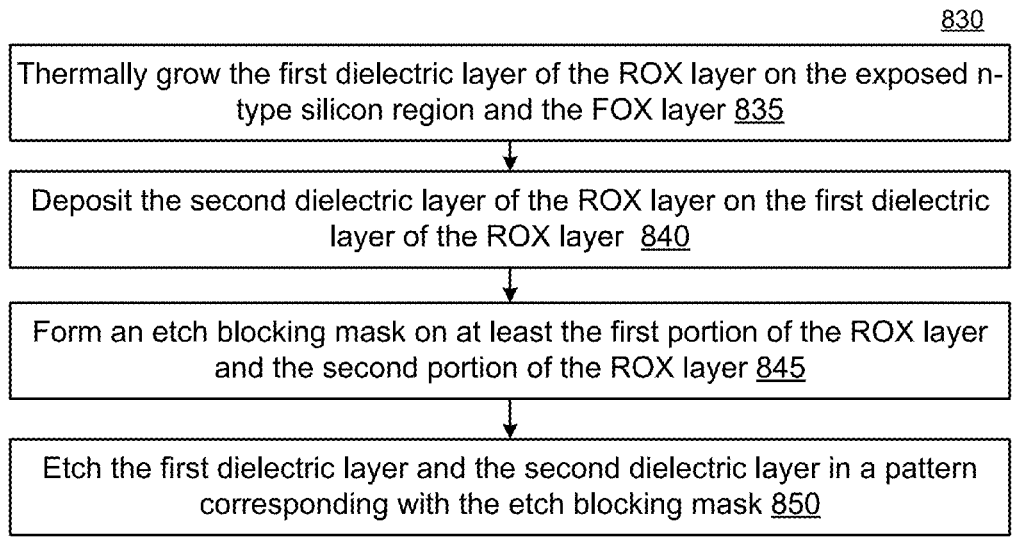
Figure 8C:
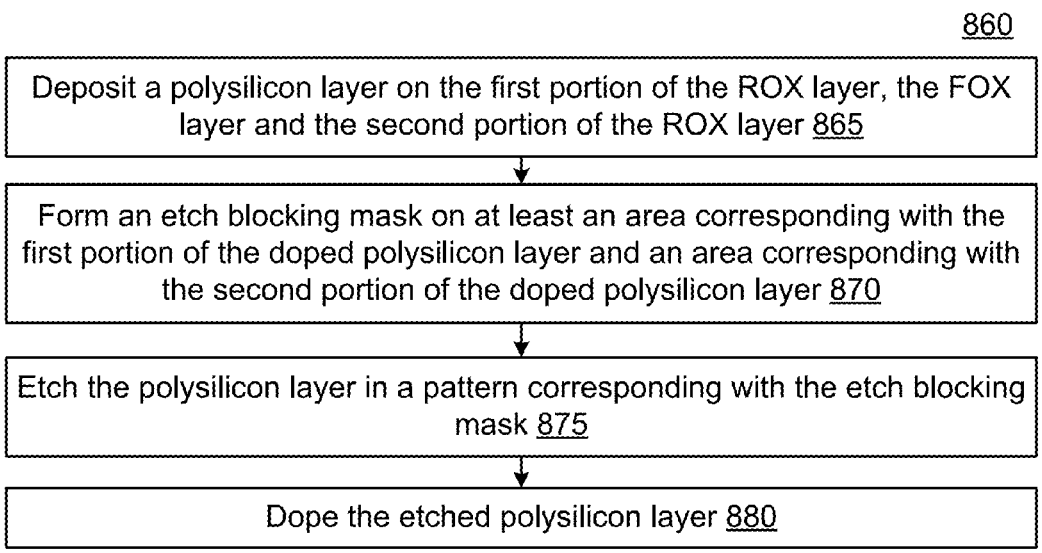

FIGS. 8A-8C are flowcharts that illustrate, respectively, methods 800, 830 and 860 for semiconductor processing, according to an embodiment. In certain embodiments, the methods 800, 830 and 860 may be implemented in conjunction with one another and, for purposes of illustration, will be described as such herein. For instance, the method 830 shown in FIG. 8B, includes operations for forming a RESURF oxide layer that can be implemented in conjunction with the method 800 of FIG. 8A. Similarly, the method 860 shown in FIG. 8C, includes operations for forming a doped polysilicon layer that can be implemented in conjunction with the method 800. In an example embodiment, the method 800 may be implemented using process steps of the semiconductor process illustrated, and described with reference to FIGS. 6A through 6M.

As shown in FIG. 8A the method 800 of semiconductor processing includes, at block 805, forming an N-type silicon region disposed within a P-type silicon substrate. For instance, the N-type silicon region may include at least one of an N-well region, a high-voltage N-well region, a buried N-type silicon layer and a highly doped N-type silicon region, and so forth. In the method 800, the P-type silicon substrate may include at least one of a P-type epitaxial layer and a P-type buried layer and/or other P-type silicon substrate. In other embodiments, the conductivity types may be reversed. For instance, at block 805, a P-type silicon region may be formed in an N-type silicon substrate.

At block 810, the method 800 includes forming a field oxide layer in (or on) the P-type silicon substrate. The field oxide layer formed at block 810 may include an opening exposing at least a portion of the N-type silicon region, where the opening may be subsequently used to form a capacitor structure, such as those described herein. The opening in the field oxide layer may be defined using a nitride layer, such as previously described.

At block 820, the method 800 includes forming a RESURF oxide layer that has a first portion disposed on the exposed N-type silicon region (e.g., for use in a capacitor structure) and a second portion disposed on the field oxide layer (e.g., for use in a resistor structure). In the method 800, the RESURF oxide layer may include a first dielectric layer in contact with the exposed N-type silicon region and the field oxide layer. In other words, the first dielectric layer of the RESURF oxide layer, in the method 800, is disposed on the exposed N-type silicon region and the field oxide layer. The RESURF oxide layer of method 800 also includes a second dielectric layer that is disposed on the first dielectric layer.

At block 820, the method 800 includes forming a doped polysilicon layer (e.g., using the techniques described herein) where the doped polysilicon has a first portion and a second portion (which may be doped alike, or doped differently, depending on the particular embodiment). In the method 800, the first portion of the doped polysilicon layer is disposed on the first portion of the RESURF oxide layer (which is disposed on the exposed N-type region). In the method 800, the first portion of the doped polysilicon layer may form an upper (top) conductive plate of a capacitor structure (such as in the capacitor structures 400, 700).

Further in the method 800, the second portion of the doped polysilicon layer is disposed on the second portion of the RESURF oxide layer, which is disposed on the field oxide layer formed at block 810. In the method 800, the second portion of the doped polysilicon layer may form a resistor polysilicon (e.g., resistor polysilicon 642) for a resistor structure (such as in the resistor structure 640).

As shown in FIG. 8 B, the method 830 of forming a RESURF oxide layer includes, at block 835, thermally growing the first dielectric layer of the RESURF oxide layer (of block 815) on the exposed N-type silicon region and the field oxide layer. The method 830 further includes, at block 840 depositing the second dielectric layer of the RESURF oxide layer (of block 815) on the first dielectric layer of the RESURF oxide layer. At block 845, the method 830 includes forming an etch blocking mask (e.g., using photolithography) on at least the first portion of the RESURF oxide layer and the second portion of the RESURF oxide layer. At block 850, the method 830 includes etching the first dielectric layer and the second dielectric layer in a pattern corresponding with the etch blocking mask, e.g., so as to define the first portion of the RESURF oxide (as a dielectric of a capacitor structure) and define the second portion of the RESURF oxide (as an underlying dielectric of a polysilicon resistor structure).

As shown in FIG. 8C the method 860 of forming a doped polysilicon layer includes, at block 865, forming a polysilicon layer on the first portion of the RESURF oxide layer, the field oxide layer and the second portion of the RESURF oxide layer, such as forming a polysilicon layer over the surface of a wafer, for example. At block 870, the method 860 includes forming an etch blocking mask (e.g., using photolithography) on at least an area corresponding with the first portion of the doped polysilicon layer (e.g., an upper plate of a capacitor structure) and an area corresponding with the second portion of the doped polysilicon layer (e.g., a resistor polysilicon of a resistor structure).

At block 875, the method 860 includes etching the polysilicon layer in a pattern corresponding with the etch blocking mask, e.g., so as to define a polysilicon feature for the first portion of the doped polysilicon layer (e.g., the upper capacitor plate) and define a polysilicon feature for the second portion of the doped polysilicon layer (e.g., the resistor polysilicon). The method 860 includes, at block 880, doping the etched polysilicon layer. Depending on the particular embodiment, the first portion of the doped polysilicon layer and the second portion of doped polysilicon layer may be similarly doped, or may be differently doped. The specific doping used for each feature will depend on the specific feature and the particular use of that feature.

Also, the semiconductor process steps described with respect to the methods 800, 830 and 860 may be used to concurrently define features of other semiconductor devices (e.g., other than a capacitor and a resistor). For instance, the semiconductor process steps described with respect to the methods 800, 830 and 860 may be used to define one or more features of a LDMOS device, one or more features of a BJT device and/or one or more features of other devices, such as in the approaches described herein.

Figure 9:
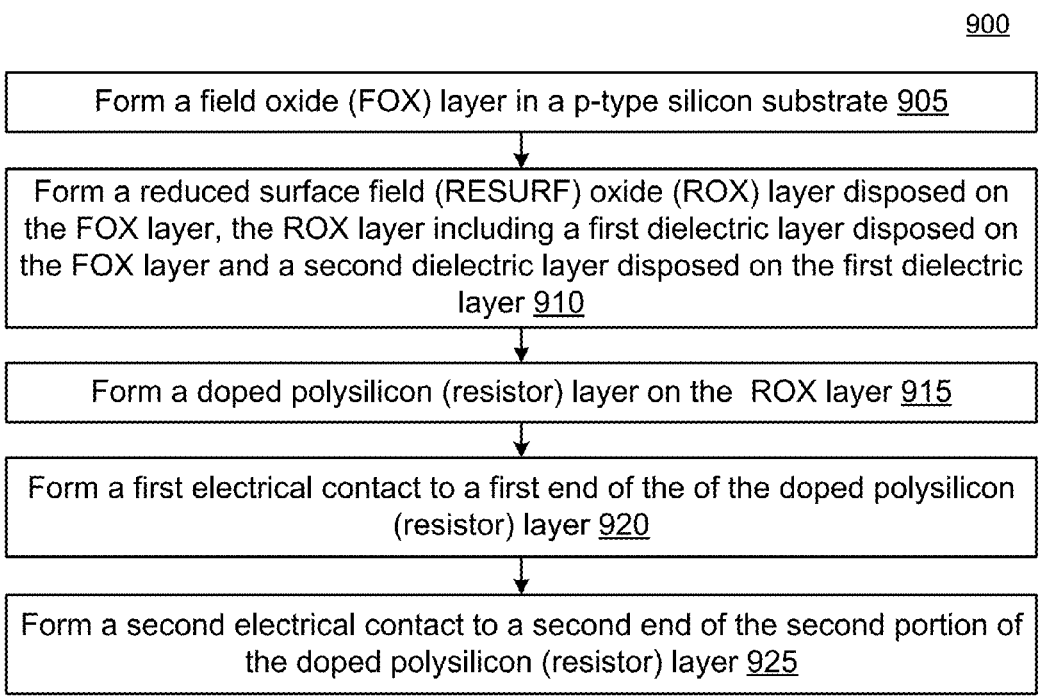
FIG. 9 is a flowchart that illustrates a method of forming a resistor structure, according to an embodiment.

FIG. 9 is a flowchart that illustrates a method 900 of forming a resistor structure, according to an embodiment. For instance, the method 900 may be used to form the resistor structures described herein. As shown in FIG. 9, the method 900 includes, at block 905, forming a field oxide layer in a P-type silicon substrate, such as in the resistor region 640 illustrated in FIGS. 6A through 6M. At block 910, the method 900 includes forming a RESURF oxide layer including a first dielectric layer disposed on the field oxide layer and a second dielectric layer disposed on the first dielectric layer.

At block 915, the method 900 includes forming a doped polysilicon layer (a resistor polysilicon) on the RESURF oxide layer, such as using the techniques described herein. At block 920, the method 900 includes forming a first electrical contact at a first end of the doped polysilicon layer and, at block 925, forming a second electrical contact to a second end of the doped polysilicon layer. In the method 900, the first electrical contact, the doped polysilicon layer and the second electrical contact form a resistor structure. Further processing may then be formed to define metal interconnects, vias and/or other structures for connecting the resistor structure with other semiconductor devices includes in the same silicon substrate and/or with other devices not included in the same substrate.

As with the process steps described with respect to the methods 800, 830 and 860, the semiconductor process steps of the method 900 may be used to concurrently define features of other semiconductor devices (e.g., other than a resistor). For instance, the semiconductor process steps described with respect to the method 900 may be used to define one or more features of a LDMOS device, one or more features of a BJT device and/or one or more features of other devices, such as in the approaches described herein.

Figure 10A:
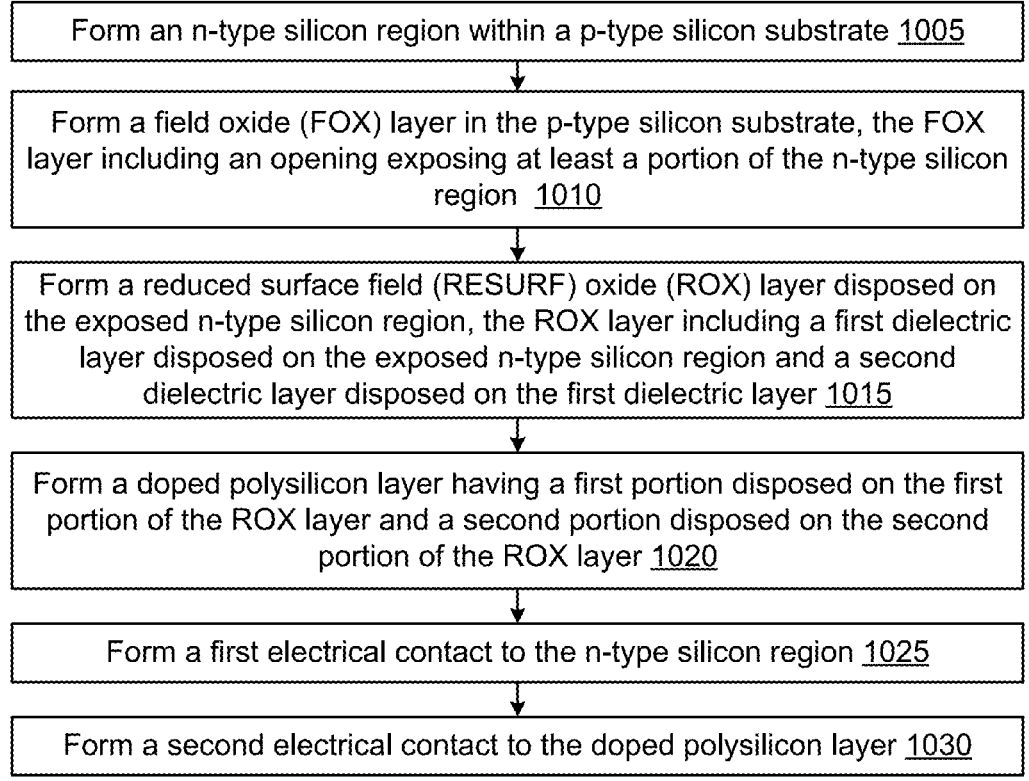
FIGS. 10A and 10B are flowcharts that illustrate methods for forming a capacitor structure in a semiconductor process, according to an embodiment.
Figure 10B:
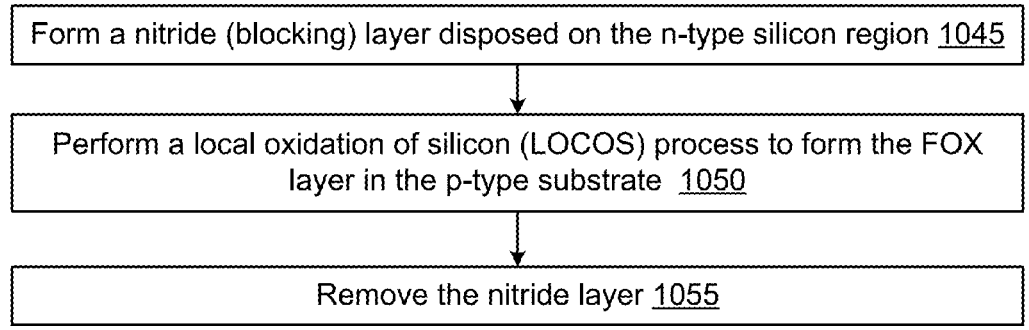

FIGS. 10A and 10B are flowcharts that illustrate, respectively, methods 1000 and 1040, for forming a capacitor structure in a semiconductor process (such as the semiconductor process described with respect to FIGS. 6A through 6M), according to an embodiment. In some embodiments, the methods 1000 and 1040 may be implemented in conjunction with one another and, for purposes of illustration, will be described as such herein. For instance, the method 1040 shown in FIG. 10B, includes operations for forming a field oxide layer that can be implemented in conjunction with the method 1000 when forming a capacitor.

As shown in FIG. 10A, the method 1000 of forming a capacitor structure includes, at block 1005, forming an N-type silicon region disposed within a P-type silicon substrate. The N-type silicon region formed at block 1005 may be used as a lower (bottom) plate of a capacitor structure, such as the N-type region 712 in the capacitor structure 700 of FIG. 7. At block 1010, the method 1000 includes forming a field oxide layer in (or on) the P-type silicon substrate. In the method 1000, the field oxide layer formed at block 1010 includes an opening that exposes at least a portion of the N-type silicon region. Depending on the particular implementation, the N-type silicon region of block 1005 may be formed before the field oxide layer of block 1010, or may be formed after the field oxide layer of block 1010.

At block 1015, the method 1000 includes forming a RESURF oxide layer (e.g., a dielectric layer of the capacitor structure) that is disposed on the exposed N-type silicon region. The RESURF oxide layer of the method 1000 includes a first dielectric layer disposed on the exposed N-type silicon region and a second dielectric layer disposed on the first dielectric layer. At block 1020, the method 1000 includes forming a doped polysilicon layer disposed on the RESURF oxide layer formed at block 1015. The doped polysilicon layer may be used as an upper (top) conductive plate of the corresponding capacitor structure.

At block 1025, the method 1000 includes forming a first electrical contact to the N-type silicon region and, at block 1030, includes forming a second electrical contact to the doped polysilicon layer. In the method 1000, the first electrical contact, the N-type silicon region, the first portion of the RESURF oxide, the first portion of the doped polysilicon layer and the second electrical contact form a capacitor structure.

As shown in FIG. 10B, the method 1040 of forming a field oxide layer includes, at block 1045, forming a nitride (blocking) layer disposed on the N-type silicon region of block 1005. At block 1050, the method 1040 includes performing a LOCOS process to form the field oxide layer in the P-type substrate, where the nitride layer prevents (blocks) formation of the field oxide layer in the portion of the N-type silicon region on which it is disposed. At block 1055, the method 1040 includes removing the nitride layer, which results in the N-type silicon region of block 1005 being exposed through an opening in the field oxide layer.

As with the process steps described with respect to the methods 800, 830, 860 and 900, the semiconductor process steps of the methods 1000 and 1040 may be used to concurrently define features of other semiconductor devices (e.g., other than a capacitor). For instance, the semiconductor process steps described with respect to the methods 1000 and 1040 may be used to define one or more features of a LDMOS device, one or more features of a BJT device and/or one or more features of other devices, such as in the approaches described herein.

Implementations of the various techniques described herein may be implemented in digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some embodiments may be implemented using various types of semiconductor processing techniques associated with semiconductor substrates including, but not limited to, for example, Silicon (Si), Galium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A method comprising:
    forming an N-type silicon region disposed within a P-type silicon substrate;
    forming a field oxide (FOX) layer in the P-type silicon substrate, the FOX layer including an opening exposing at least a portion of the N-type silicon region;
    forming a reduced surface field (RESURF) oxide (ROX) layer having a first portion disposed on the exposed N-type silicon region and a second portion disposed on the FOX layer, the ROX layer including a first dielectric layer in contact with the exposed N-type silicon region and the FOX layer, and a second dielectric layer disposed on the first dielectric layer; and
    forming a doped polysilicon layer having a first portion disposed on the first portion of the ROX layer and a second portion disposed on the second portion of the ROX layer.

2. The method of claim 1, further comprising:
    forming a first electrical contact to the N-type silicon region; and
    forming a second electrical contact to the first portion of the doped polysilicon layer, the first electrical contact, the N-type silicon region, the first portion of the ROX, the first portion of the doped polysilicon layer and the second electrical contact forming a capacitor.

3. The method of claim 1, wherein the second portion of the doped polysilicon layer includes a first end and a second end, the method further comprising:
    forming a first electrical contact to the first end of the second portion of the doped polysilicon layer; and
    forming a second electrical contact to the second end of the second portion of the doped polysilicon layer, the first electrical contact, the second portion of the doped polysilicon layer and the second electrical contact forming a resistor.

4. The method of claim 1, wherein the N-type silicon region includes at least one of an N-well region, a high-voltage N-well region, a buried N-type silicon layer and a highly doped N-type silicon region.

5. The method of claim 1, wherein the P-type silicon substrate includes at least one of a P-type epitaxial layer and a P-type buried layer.

6. The method of claim 1, wherein forming the ROX layer includes:
thermally growing the first dielectric layer of the ROX layer on the exposed N-type silicon region and the FOX layer;
depositing the second dielectric layer of the ROX layer on the first dielectric layer of the ROX layer;
forming an etch blocking mask on at least the first portion of the ROX layer and the second portion of the ROX layer; and
etching the first dielectric layer and the second dielectric layer in a pattern corresponding with the etch blocking mask.

7. The method of claim 1, wherein forming the FOX layer and the exposed N-type silicon region includes:
forming a nitride layer disposed on the N-type silicon region;
performing a local oxidation of silicon (LOCOS) process to form the FOX layer in the P-type substrate; and
removing the nitride layer.

8. The method of claim 1, wherein forming the doped polysilicon layer includes:
forming a polysilicon layer on the first portion of the ROX layer, the FOX layer and the second portion of the ROX layer;
forming an etch blocking mask on at least an area corresponding with the first portion of the doped polysilicon layer and an area correspond with the second portion of the doped polysilicon layer;
etching the polysilicon layer in a pattern corresponding with the etch blocking mask; and
doping the etched polysilicon layer.

9. A capacitor formed using a semiconductor process, the capacitor comprising:
an N-type silicon region disposed in a P-type silicon substrate;
a field oxide (FOX) layer disposed in the P-type substrate, the FOX layer including an opening exposing at least a portion of the N-type silicon region;
a reduced surface field (RESURF) oxide (ROX) layer having a first portion disposed on the exposed N-type silicon region and a second portion disposed on the FOX layer, the ROX layer including a first dielectric layer disposed on the exposed N-type silicon region and a second dielectric layer disposed on the first dielectric layer; and
a doped polysilicon layer disposed on the first portion of the ROX layer.

10. The capacitor of claim 9, further comprising:
a first electrical contact coupled with the N-type silicon region, the first electrical contact configured to operate as a first terminal of the capacitor; and
a second electrical contact coupled with the doped polysilicon layer, the second electrical contact configured to operate as a second terminal of the capacitor.

11. The capacitor of claim 9, wherein:
the first dielectric layer of the ROX layer includes a thermally grown oxide layer disposed on the exposed N-type silicon region and the FOX layer; and
the second dielectric layer of the ROX layer includes a deposited oxide layer disposed on the thermally grown oxide layer.

12. The capacitor of claim 9, wherein:
the first dielectric layer of the ROX layer includes a first oxide layer disposed on the exposed N-type silicon region and the FOX layer; and
the second dielectric layer of the ROX layer includes a second oxide layer disposed on the first oxide layer, the second oxide layer having a thickness that is at least four times a thickness of the first oxide layer.

13. The capacitor of claim 9, wherein the N-type silicon region includes at least one of an N-well region, a high-voltage N-well region, a buried N-type silicon layer and a highly doped N-type silicon region.

14. The capacitor of claim 9, wherein the P-type silicon substrate includes at least one of a P-type epitaxial layer and a P-type buried layer.

15. A resistor structure formed using a semiconductor process, the resistor structure comprising:
a silicon substrate;
an N-type silicon region disposed in the silicon substrate;
a field oxide (FOX) layer disposed on the silicon substrate;
a reduced surface field (RESURF) oxide (ROX) layer having a first portion disposed on the FOX layer and a second portion disposed on the N-type silicon region, the ROX layer including a first dielectric layer disposed on the FOX layer and the N-type silicon region, and a second dielectric layer disposed on the first dielectric layer; and
a doped polysilicon resistor disposed on the first portion of the ROX layer.

16. The resistor structure of claim 15, wherein the doped polysilicon resistor includes a first end and a second end, the resistor structure further comprising:
a first electrical contact coupled with the first end of the doped polysilicon resistor, the first electrical contact configured to operate as a first terminal of the resistor structure; and
a second electrical contact coupled with the second end of the doped polysilicon resistor, the second electrical contact configured to operate as a second terminal of the resistor structure.

17. The resistor structure of claim 15, wherein:
the first dielectric layer of the ROX layer includes a thermally grown oxide layer; and
the second dielectric layer of the ROX layer includes a deposited oxide layer.

18. The resistor structure of claim 15, wherein:
the first dielectric layer of the ROX layer includes a first oxide layer; and
the second dielectric layer of the ROX layer has a thickness that is at least four times a thickness of the first oxide layer.

19. The resistor structure of claim 15, wherein the silicon substrate includes at least one of a P-type epitaxial layer, a P-type buried layer, an N-type epitaxial layer and a buried, N-type layer.

* * * * *